United States Patent
Wasserbauer

(10) Patent No.: US 12,391,542 B2
(45) Date of Patent: Aug. 19, 2025

(54) MICROELECTROMECHANICAL ACTUATOR ON INSULATING SUBSTRATE

(71) Applicant: MICROGLASS LLC, Castro Valley, CA (US)

(72) Inventor: John Wasserbauer, Castro Valley, CA (US)

(73) Assignee: microGlass LLC, Castro Valley, CA (US)

( * ) Notice: Subject to any disclaimer, the term of this patent is extended or adjusted under 35 U.S.C. 154(b) by 0 days.

(21) Appl. No.: 18/530,207

(22) Filed: Dec. 6, 2023

(65) Prior Publication Data
US 2025/0214829 A1  Jul. 3, 2025

Related U.S. Application Data

(62) Division of application No. 17/503,470, filed on Oct. 18, 2021, now Pat. No. 12,030,771.

(51) Int. Cl.
*B81B 3/00* (2006.01)

(52) U.S. Cl.
CPC ...... *B81B 3/0021* (2013.01); *B81B 2201/033* (2013.01); *B81B 2203/019* (2013.01); *B81B 2203/0307* (2013.01); *B81B 2203/033* (2013.01); *B81B 2207/07* (2013.01)

(58) Field of Classification Search
CPC .......... B81B 2201/03; B81B 2201/033; B81B 2201/035; B81B 2203/04; B81B 3/0021; B81C 1/00166
See application file for complete search history.

(56) References Cited

U.S. PATENT DOCUMENTS

| | | | | |
|---|---|---|---|---|
| 5,631,514 A | * | 5/1997 | Garcia | F16H 21/16 310/40 MM |
| 6,328,903 B1 | * | 12/2001 | Vernon, Sr. | H02N 1/008 216/2 |
| 2001/0034938 A1 | * | 11/2001 | Behin | H02N 1/008 29/830 |

* cited by examiner

*Primary Examiner* — Moazzam Hossain
(74) *Attorney, Agent, or Firm* — Nicholas E. Blanton; Wasserbauer Law LLC

(57) ABSTRACT

The present disclosure relates to an apparatus, system, and method for a microelectromechanical (MEM) device formed on a transparent, insulating substrate. The MEM device may take the form of an electrostatic comb actuator. The fabrication process employs three-dimensional structuring of the substrate to form the actuator combs, biasing elements, and linkages. The combs and other elements of the actuator may be rendered electrically conducting by a conformal conductive coating. The conductive coating may be segmented into a plurality of electrodes without the use of standard lithography techniques. A linear-rotational actuator is provided, which may comprise two perpendicularly-arranged, linear actuators that utilize moveable linkage beams in two orthogonal dimensions. A linear or torsional ratcheting actuator is also provided by using comb actuators in conjunction with a ratcheting wheel or cog. Furthermore, several methods for electrically connecting non-contiguous or enclosed elements are provided.

9 Claims, 16 Drawing Sheets

MICROELECTROMECHANICAL ACTUATOR ON INSULATING SUBSTRATE

CROSS REFERENCE TO RELATED APPLICATION

This application is a divisional of, claims priority to and the benefit of, co-pending U.S. Non-Provisional patent application Ser. No. 17/503,470, filed Oct. 18, 2023, entitled "Microelectromechanical Actuator On Insulating Substrate", which is incorporated herein by reference in its entirety.

TECHNICAL FIELD

The present disclosure generally relates to an apparatus, system, and methods of fabrication for a microelectromechanical actuator and, in particular, to a microelectromechanical actuator fabricated on an insulating substrate.

BACKGROUND

Many advances have been made in the design and fabrication of micro-electro-mechanical systems (MEMS). Microelectromechanical (MEM) devices commonly use electrostatic comb actuators to generate linear or circular motion. However, two main problems exist with present electrostatic comb actuators. First, comb actuators are generally considered to be low power, low output force devices-problems that are at least partially attributable to limitations in conventional manufacturing techniques, such as surface micromachining and silicon-on-insulator (SOI) micromachining. Second, regardless of the manufacturing technique that is employed, conventional comb actuators require a conductive material in order to effect electrostatic action. In surface micromachining, the requisite conductivity is typically supplied by a doped polysilicon layer, which is deposited along with a sacrificial layer on a substrate. Typically, the thickness of the polysilicon layer ranges from about 1 µm to about 2 µm. Selective etching of the underlying sacrificial layer releases features formed in the polysilicon layer, which form the tines of the combs in the actuator. Since it is the lateral or side-facing electrical fields that provide the bulk of the attractive or repellent forces between electrodes, the intertine gap aspect ratio determines the amount of force that can be generated per electrode pair. Surface micromachined tines forming the combs may be about 2 µm high and spaced at least 2 µm apart for an aspect ratio (height/width) of 1:1. In this scenario, the limitation is the thickness of the polysilicon layer that can be deposited. Two factors dictate this limitation: (1) the film stress, which increases with height/thickness, and (2) the cost associated with long deposition times. While surface micromachining does have the advantage of cost, it is difficult to integrate with, for example, microfluidic channels, pumps, valves, etc.

Silicon-on-insulator (SOI)-wafer-based surface micromachining, on the other hand, represents a manufacturing technique capable of achieving higher aspect ratios, albeit at the expense of additional complexity and cost. SOI micromachining begins with a doped silicon-on-insulator (SOI) substrate wherein a full-thickness, doped, single-crystal silicon wafer is wafer bonded to a silicon handle wafer at high temperature. A thin layer of silicon is sliced from the doped substrate using either proton or oxygen ion bombardment (typically up to 5 µm thick). It is then attached to an oxide-coated, silicon handle wafer via wafer bonding. At this point, etching of the sacrificial oxide layer would release all elements fabricated in the doped silicon layer. Therefore, additional steps are necessary to form anchors to the substrate. First, it is necessary to open vias in the doped silicon and underlying oxide layers where anchors are desired. Then, silicon epitaxy is used to form the MEM device layer, which is anchored to the substrate through the vias in the oxide layer. Since it is single crystal, the epitaxial silicon is stress-free and may be grown to any desired thickness, typically >10 µm. The epitaxial, single-crystal silicon layer is then patterned to form the actuator features. Selective etching of the underlying oxide layer releases the features and ultimately forms the tines of the comb drive. Aspect ratios of 4:1 or 5:1 can be generated in this manner. This geometry comes with considerable additional complexity and cost and is therefore not widely adopted. Another approach combines surface micromachining with backside bulk micromachining to produce comb actuators with aspect ratios of approximately 8:1. This approach is mainly directed toward 2D scanning mirrors and would be challenging to integrate with, for example, microfluidic channels, pumps, valves, etc.

Surface, SOI and bulk micromachining produce structures that are 2.5D; that is, they are more complex than two-dimensional structures, but are not quite three-dimensional structures. As mentioned, these techniques produce electrostatic comb actuators capable of providing limited drive forces of about 10 to 30 microNewtons (UN); to achieve this level of output force, the comb actuator requires a relatively high operating voltage, up to 100 Volts or more. The relatively low drive force of conventional comb actuators limits their usefulness as power sources for many types of MEM devices. Furthermore, the 2.5D nature of the fabrication process limits (1) the types of devices that can be made and (2) their integration with microfluidics.

Despite strong incentives across a variety of industries, there remains a long-felt need for true three-dimensional MEMS technology, capable of achieving high aspect ratios, high output forces, and comparatively low operating voltages, as well as the ability to manufacture a variety of three-dimensional shapes, suitable for a variety of applications. It would also be beneficial to have MEM devices that can be integrated with microfluidics or photonics, and that can be fabricated on insulating and/or transparent substrates. Other desirable features and characteristics will become apparent from the subsequent detailed description, the drawings, and the appended claims, when considered in view of this background.

SUMMARY

The present invention provides for embodiments and methods of fabrication of true three-dimensional MEM devices that comprise features disposed on an insulating substrate, wherein said features may be configured to perform a variety of functions. Among the functions contemplated herein, a MEM device may comprise features appropriate for applications including, but not limited to, drug discovery, DNA sequencing, electrophoresis, sensing, defense, bio-medical, manufacturing, consumer products, aviation, automotive, integrated circuits (e.g., micro-cooling), inspection, and safety systems. Furthermore, among the functions contemplated herein, a MEM device may comprise an electrostatic comb actuator. Representative substrates may include glass and sapphire.

In one aspect of an exemplary embodiment of the present invention, femtosecond-pulsed lasers provide a fabrication technique that allows for true three-dimensional structures to be fabricated by processing a transparent, insulating substrate. One advantage of employing this method is that no sacrificial layers are needed. Another advantage is that high aspect ratios may be obtained. Another advantage is that true three-dimensional structures can be realized. Yet another advantage is that microfluidic channels and devices may be integrated on the same chip with the same process.

In a further embodiment in accordance with the above, two-photon polymerization provides a fabrication technique that allows for true three-dimensional structures to be fabricated with insulating polymer material and integrated with true three-dimensional structures fabricated by femtosecond laser structuring on an insulating substrate.

In a further embodiment in accordance with the above, surface micromachining provides a fabrication technique that allows for 2.5D actuators to be integrated with true three-dimensional structures fabricated by femtosecond laser structuring on an insulating substrate.

In a further embodiment in accordance with the above, any fabrication technique suited to provide for true three-dimensional structures to be fabricated on, or by processing, an insulating substrate, falls within the purview of this disclosure.

In another aspect of an exemplary embodiment in accordance with any of the above, magnetron sputter deposition provides a fabrication technique for depositing one or more conductive layers on an insulating substrate.

In a further embodiment in accordance with any of the above, evaporation with planetary rotation of the substrate provides a fabrication technique for depositing one or more conductive layers on an insulating substrate. As used here, "planetary rotation" refers to a process wherein the normal axis of the wafer is tilted with respect to the source, as the Earth's axis is tilted with respect to the sun; as the wafer rotates, the beam of atoms from the source will 'see' different sides of a 3D feature and coat them all accordingly.

In a further embodiment in accordance with any of the above, any conformal deposition process may be used for depositing one or more conductive layers on an insulating substrate or three-dimensional structure. Furthermore, at least three methods of segmenting a monolithically deposited conductive layer without the need for liftoff or post-deposition etching are provided to fabricate said separate subcomponents.

In another aspect of an exemplary embodiment in accordance with any of the above, three-dimensional features defining a trench may be used to segment the conformal horizontal and vertical portions of a conductive layer into separate subcomponents.

In a further embodiment in accordance with any of the above, three-dimensional features define a method for inducing segmentation via a suspended element, such as a biasing element, or a spring.

In a further embodiment in accordance with any of the above, three-dimensional features define a method for inducing segmentation via an overhang or an undercut.

In yet a further embodiment in accordance with any of the above, three-dimensional features define a method for inducing segmentation via any 3D shape that obscures the atomic flux of the deposition process, resulting in a deposition-free zone.

In yet a further embodiment in accordance with any of the above, segmentation of a conductive layer is achieved via a temporary, external shadow mask, first applied, and then removed from the insulating substrate.

In another aspect of an exemplary embodiment in accordance with any of the above, the present invention advantageously provides a common process wherein both MEMS and microfluidics may be fabricated on a single substrate.

In another aspect of an exemplary embodiment in accordance with any of the above, the present invention advantageously provides a common process wherein both MEMS and photonics may be fabricated on a transparent substrate.

In yet another aspect of an exemplary embodiment in accordance with any of the above, a linear actuator MEM device may be fabricated on an insulating substrate.

In a further embodiment in accordance with any of the above, a linear-rotational actuator is provided that may be fabricated on an insulating substrate.

In a further embodiment in accordance with any of the above, a linear ratcheting actuator is provided that can be fabricated on an insulating substrate.

In a further embodiment in accordance with any of the above, a torsional ratcheting actuator is provided that can be fabricated on an insulating substrate.

In a further embodiment in accordance with any of the above, a two-stroke rachet pawl actuator is provided having improved speed and efficiency characteristics.

In yet another aspect of an exemplary embodiment in accordance with any of the above, an apparatus, system, and/or method is provided, which eliminates hysteresis in the motion of an actuator thereby increasing precision in the movement of the actuator.

It is an object of the present disclosure to allow integration of these devices with other technologies that are compatible with insulators and transparent substrates, such as microfluidics, photonics, sensors, etc.

DESCRIPTION OF THE DRAWINGS

Non-limiting and non-exhaustive embodiments of the present invention are described with reference to the following drawings. In the drawings, like numerals describe like components throughout the several views.

For a better understanding of the present invention, reference will be made to the following Detailed Description, which is to be read in association with the accompanying drawings, which are incorporated in and constitute a part of this specification, show certain aspects of the subject matter disclosed herein, and, together with the description, help explain some of the principles associated with the disclosed implementations, wherein.

DETAILED DESCRIPTION

Figure 1:
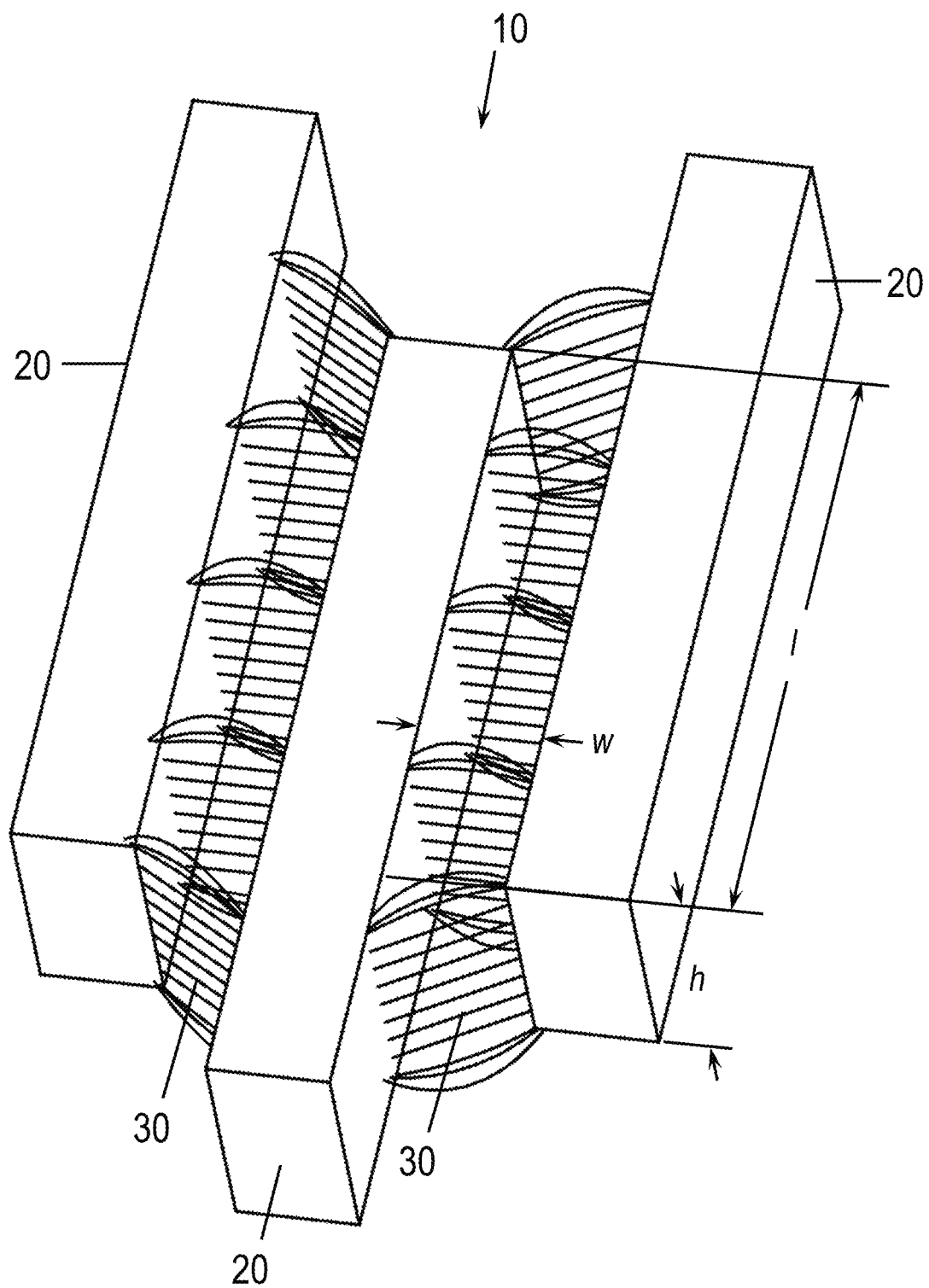
FIG. 1 illustrates a schematic, perspective view of interdigitated fingers of an electrostatic comb drive, according to an embodiment of the present invention.

Non-limiting embodiments of the invention will be described below with reference to the accompanying drawings, wherein like reference numerals represent like elements throughout. While the invention has been described in detail with respect to the preferred embodiments thereof, it will be appreciated that upon reading and understanding of the foregoing, certain variations to the preferred embodiments will become apparent, which variations are nonetheless within the spirit and scope of the invention. The drawings featured in the figures are provided for the purposes of illustrating some embodiments of the invention and are not to be considered as limitation thereto.

The terms "a" or "an", as used herein, are defined as one or as more than one. The term "plurality", as used herein, is defined as two or as more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically.

Reference throughout this document to "some embodiments", "one embodiment", "certain embodiments", and "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means any of the following: "A; B; C; A and B; A and C; B and C; A, B and C". An exception to this definition will occur only when a combination of elements, functions, steps or acts are in some way inherently mutually exclusive.

The drawings featured in the figures are provided for the purposes of illustrating some embodiments of the present invention and are not to be considered as limitation thereto. The term "means" preceding a present participle of an operation indicates a desired function for which there is one or more embodiments, i.e., one or more methods, devices, or apparatuses for achieving the desired function and that one skilled in the art could select from these or their equivalent in view of the disclosure herein and use of the term "means" is not intended to be limiting.

FIG. 1 shows a schematic, exemplary electrostatic comb actuator 10. The comb actuator 10 comprises a series of interdigitated electrodes 20, also called tines, which are formed from single crystal silicon or polysilicon and disposed on a substrate. The silicon layer may be doped so that the MEM layers are highly conductive. When a voltage is applied between the electrodes, an electric field 30 is generated, substantially as shown. The electric field 30 produces an attractive force between the electrodes 20 which urges the electrodes to greater meshing or overlap in the lengthwise direction thereof. Typically, one set of electrodes is moveable while the other set remains stationary relative to the substrate. The moveable set of electrodes, then, converts electrical energy into mechanical energy. The force is proportional to the amount of energy stored as capacitance between the tines of the comb. The stored energy is given by $$E = \frac{1}{2}CV^2,$$

where C is the capacitance and V is the applied voltage. The capacitance is related to the geometry of the interdigitated electrodes 20 by $$C = \epsilon \frac{A}{w}$$

where A is equal to l×h, the overlapping area between two adjacent electrodes 20, w is the perpendicular, free-space distance between the electrodes 20, and e is the permittivity of the free space. Therefore, to increase the force generated per unit-length of a given interdigitated electrode 20 pair, it is necessary to maximize the ratio of h/w, where h is the height of the electrode 20.

The present disclosure provides several methods for fabricating an actuator, such as an exemplary electrostatic comb actuator 10. Three fabrication processes are contemplated in this disclosure: femtosecond laser structuring (FLS), FLS with two-photon polymerization (2PP), and FLS with surface micromachining (SMM). All three techniques are capable of producing three-dimensional MEM devices on insulating and transparent substrates. Likewise, all three techniques allow integration of these devices with other technologies fabricated on insulating and transparent substrates, such as microfluidics, photonics, sensors, etc. The first two techniques, FLS and FLS+2PP, require a conductive layer, such as a metal, to be deposited after 3D structure fabrication in order to enable actuation. FLS+SMM, on the other hand, does not require a conductive layer coating because conductivity is provided by the doped polysilicon mechanical layer. Nevertheless, it may be advantageous to include a conductive layer for the purposes of adding structural integrity and/or electrodes to the device. Both FLS and FLS+2PP are capable of producing high aspect ratio interdigitated comb features relative to standard polysilicon MEM devices. Advantageously, with sufficiently high aspect ratios for both the comb features and the conformal coatings, enhanced forces may be generated per pair of electrode tines 20, as shown in FIG. 1.

Figure 2A:
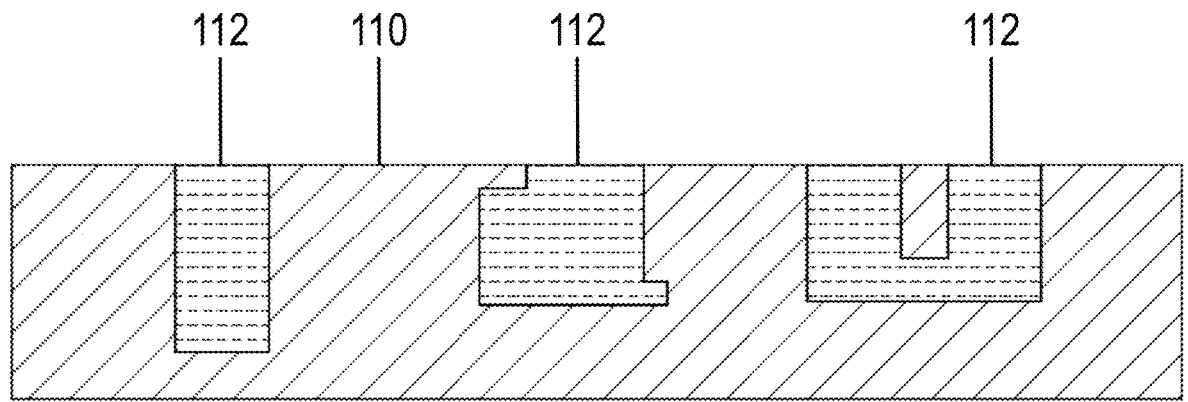
FIG. 2A illustrates a sectional view of an insulating substrate with various femtosecond, laser-irradiated structures in a first fabrication step for an electrostatic comb actuator produced by femtosecond laser structuring, according to an embodiment of the present invention.
Figure 2B:
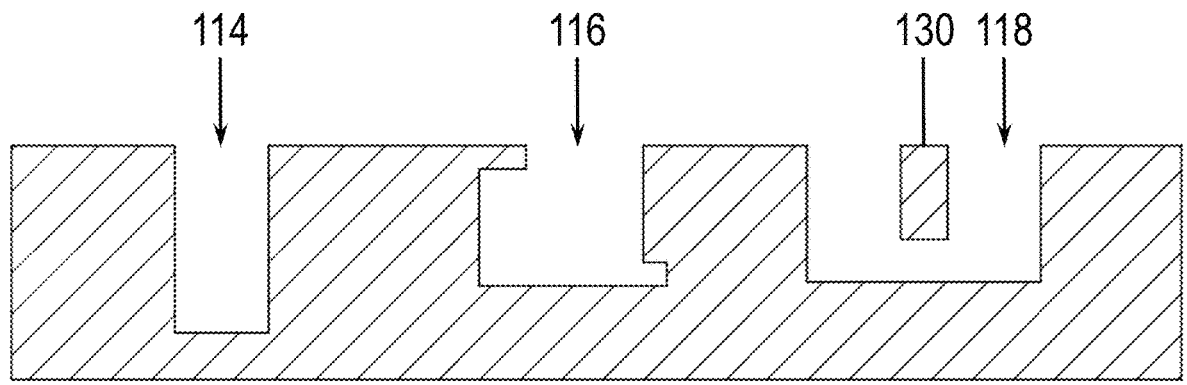
FIG. 2B illustrates a sectional view of an insulating substrate after an etching process in a second fabrication step for an electrostatic comb actuator produced by femtosecond laser structuring, according to an embodiment of the present invention.
Figure 2C:
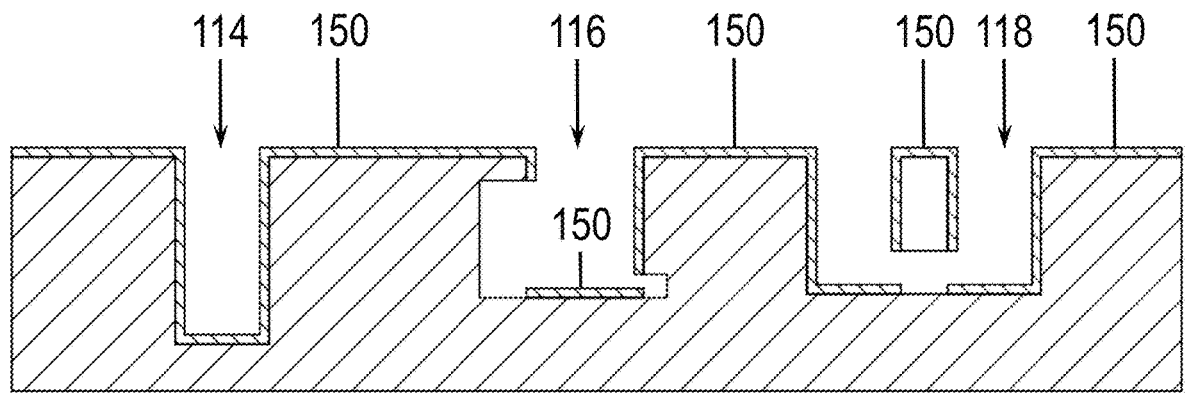
FIG. 2C illustrates a sectional view of an insulating substrate after a conformal conductive layer deposition process in a third fabrication step for an electrostatic comb actuator produced by femtosecond laser structuring, according to an embodiment of the present invention.

The FLS fabrication process is illustrated in FIGS. 2A-2C. Referring to FIG. 2A, a substrate 110, which may be a transparent substrate such as glass or sapphire, may be irradiated with a series of femtosecond laser pulses focused inside the substrate 110. The pulses may be used to write volume pixels 112, or voxels, which may be selectively etchable using wet chemistry. In FIG. 2B the voxels have been etched away leaving behind one or more trenches, cavities or voids 114, one or more undercut and/or overhang trenches 116, and/or one or more recesses 118 having suspended elements, such as a biasing element 130. Etching may be achieved through a suitable wet chemistry, such as heated potassium hydroxide (KOH) or hydrofluoric acid (HF).

In FIG. 2C a conductive layer 150 has been disposed on the substrate and on the etched features. The conductive layer may comprise one or more metal layers, one or more conductive semiconductor layers, and/or one or more transparent conductive layers. One or more conductive layers may serve various functions; functions contemplated herein include promoting adhesion to the substrate, acting as a solder barrier, acting as a structural element, forming a wire-bondable surface, and/or acting as an electrode. Example adhesion layer metals may include Titanium and/or Chromium. Example barrier metals may include Nickel and/or Palladium. Example structural layers may include Copper and/or Tungsten. Example bondable metals include Gold and/or Platinum. An example conductive semiconductor layer is doped polysilicon. An example transparent conductive layer is indium tin oxide (ITO). All of these materials may function as an electrode.

Figure 3A:
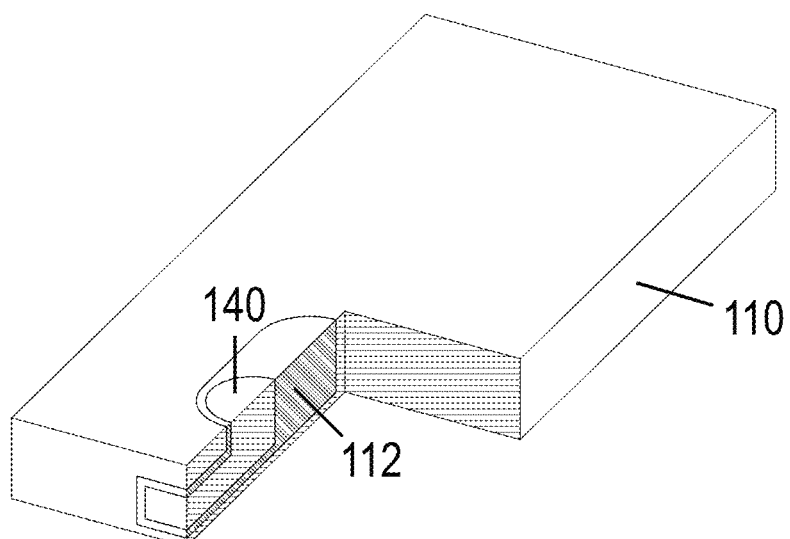
FIG. 3A illustrates a perspective, partial cutaway view of an insulating substrate with various femtosecond laser irradiated structures in a first fabrication step for an electrostatic comb actuator produced by femtosecond laser structuring and two-photon polymerization, according to an embodiment of the present invention.
Figure 3B:
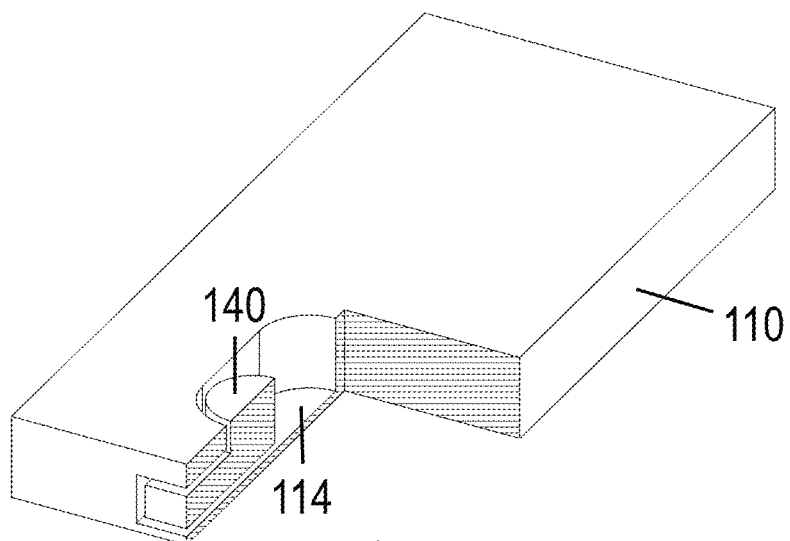
FIG. 3B illustrates a perspective, partial cutaway view of an insulating substrate with various wet-etched structures in a second fabrication step for an electrostatic comb actuator produced by femtosecond laser structuring and two-photon polymerization, according to an embodiment of the present invention.
Figure 3C:
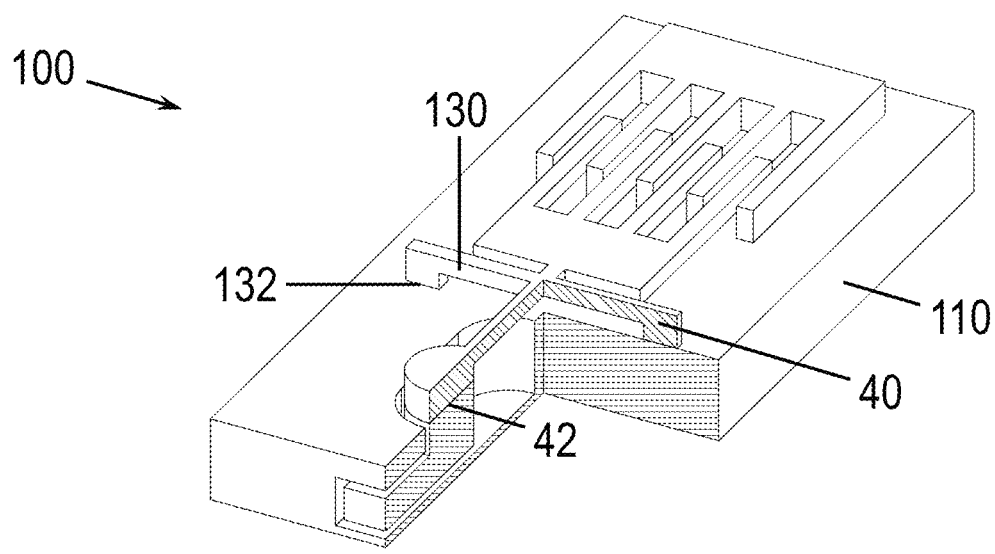
FIG. 3C illustrates a perspective, partial cutaway view of an insulating substrate with various two-photon polymerized structures in a third fabrication step for an electrostatic comb actuator produced by femtosecond laser structuring and two-photon polymerization, according to an embodiment of the present invention.
Figure 4A:
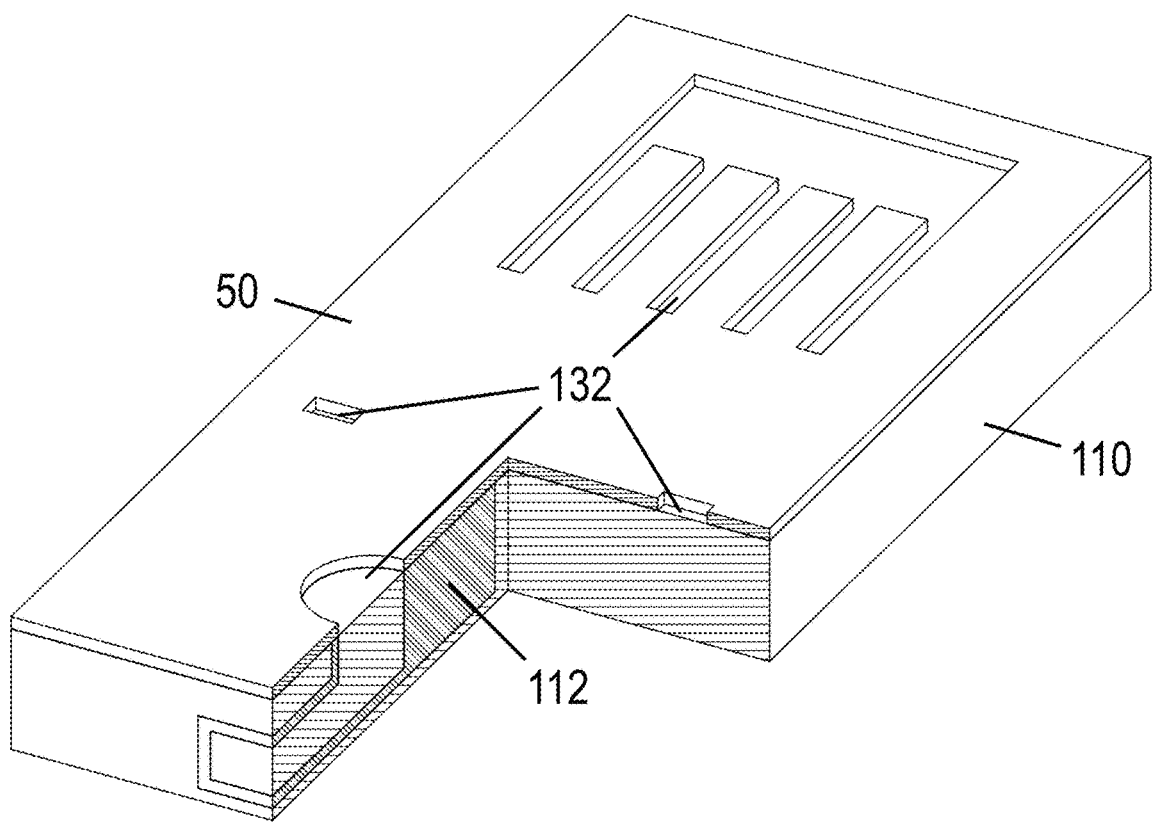
FIG. 4A illustrates a perspective, partial cutaway view of an insulating substrate with a patterned, sacrificial oxide layer in a second fabrication step for an electrostatic comb actuator produced by femtosecond laser structuring and surface micromachining, according to an embodiment of the present invention.
Figure 4B:
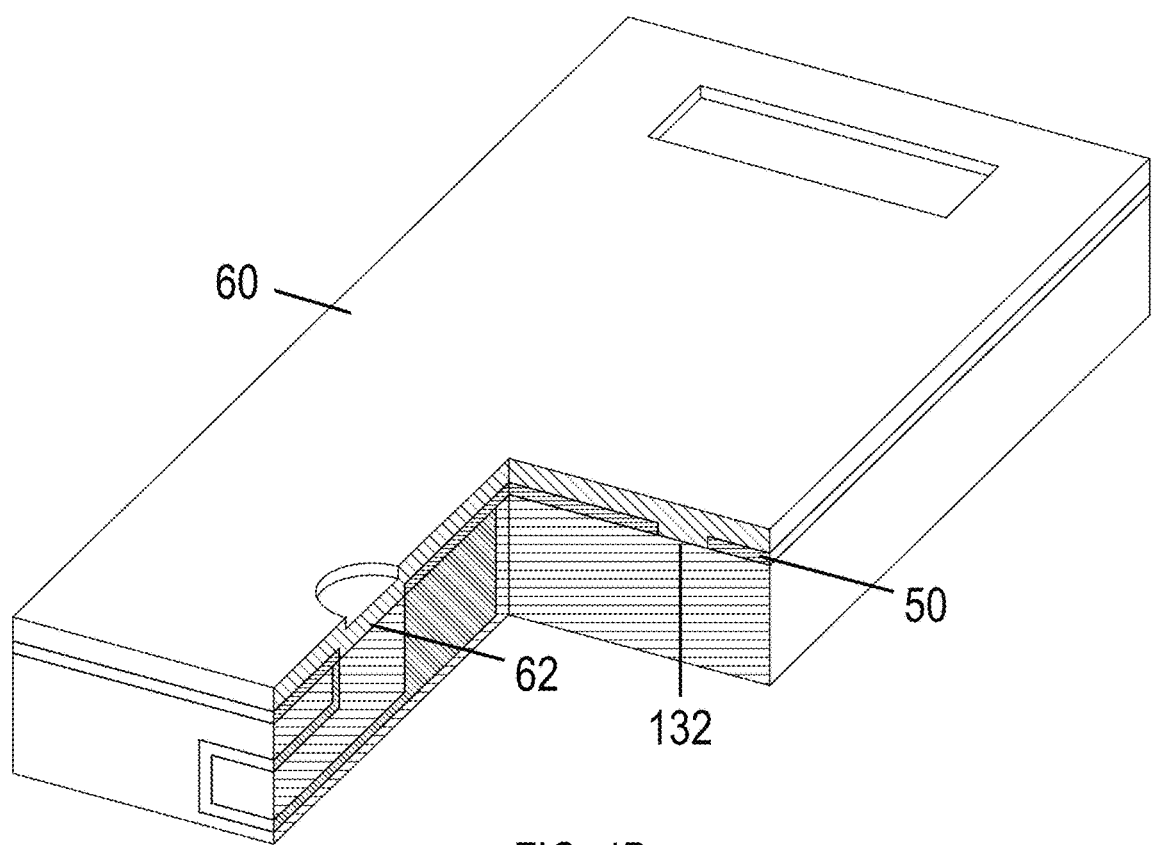
FIG. 4B illustrates a perspective, partial cutaway view of an insulating substrate with a polysilicon deposition layer in a third fabrication step for an electrostatic comb actuator produced by femtosecond laser structuring and surface micromachining, according to an embodiment of the present invention.
Figure 4C:
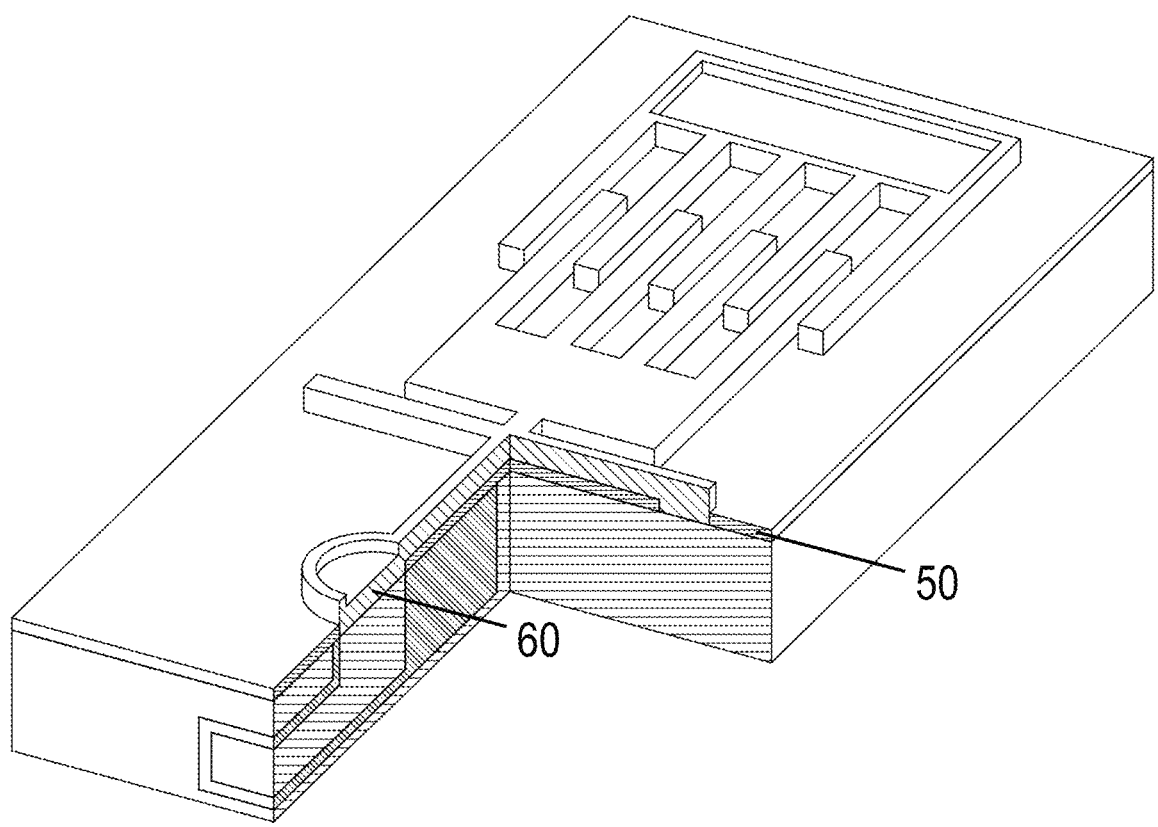
FIG. 4C illustrates a perspective, partial cutaway view of an insulating substrate with a patterned polysilicon layer in a fourth fabrication step for an electrostatic comb actuator produced by femtosecond laser structuring and surface micromachining, according to an embodiment of the present invention.
Figure 4D:
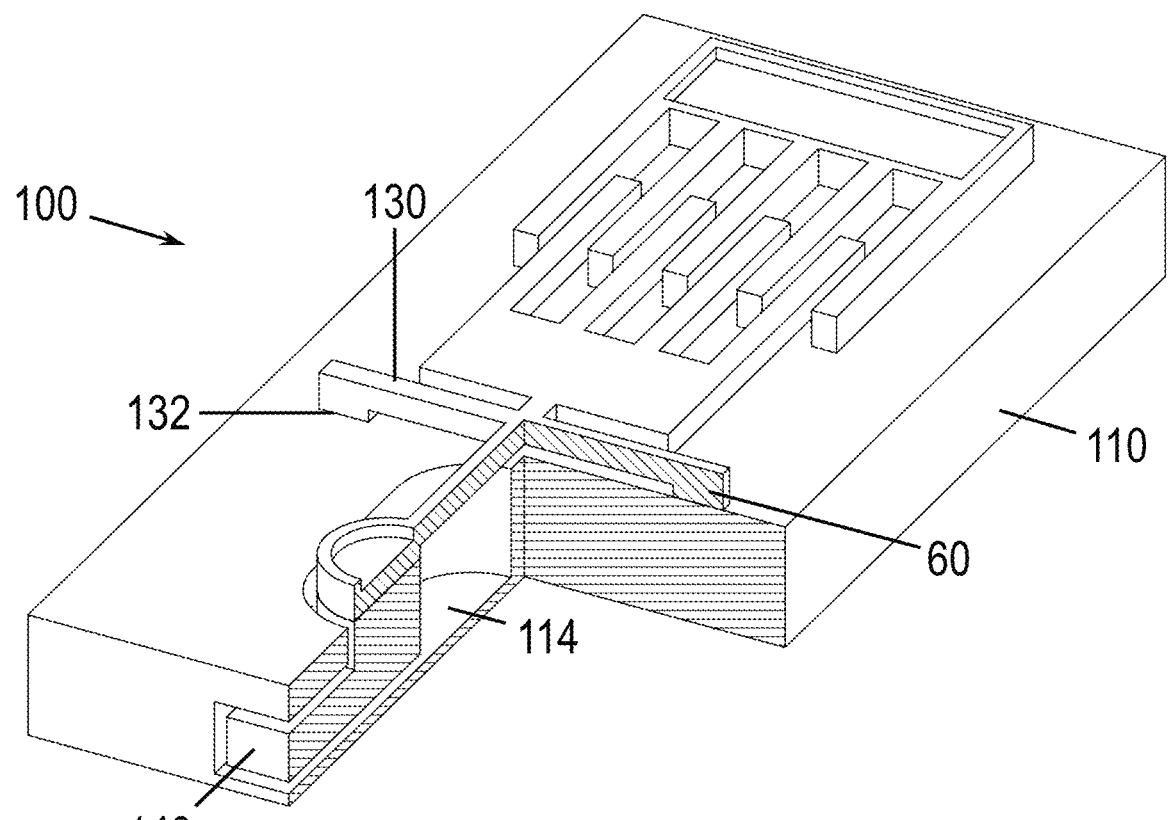
FIG. 4D illustrates a perspective, partial cutaway view of an insulating substrate with an etched sacrificial oxide layer in a fifth fabrication step for an electrostatic comb actuator produced by femtosecond laser structuring and surface micromachining, according to an embodiment of the present invention.

The fabrication process for FLS and 2PP is illustrated in FIGS. 3A-3C. Because the materials used in 2PP are incompatible with the FLS wet chemistry, the FLS process must be completed prior to 2PP. In FIG. 3A the substrate 110 is irradiated 112 to form a suspended or free-floating linkage beam 140 or other passive component to be moved by the actuator. In FIG. 3B the irradiated features are preferentially etched away to form a trench, cavity or void 114 allowing the linkage beam 140 to move. In FIG. 3C, 2PP is used to form the comb drive 100 elements on the surface of the substrate 110. This is accomplished by immersing the substrate in a monomer resin and cross-linking it with a laser beam focused inside the resin which converts the monomer liquid into a polymer solid 40. As with many other additive manufacturing techniques, the features may be disposed layer-by-layer from the bottom up. Alternatively, the printing beam can be moved in 3 dimensions to form arbitrary shapes, such as wires or waveguides. A layer printed at the surface level forms a bond 42 with the glass substrate 110 and can be used to create anchor points 132 from which cantilevered or suspended elements, such as a biasing element 130, can be formed. In this example, both anchored and suspended elements are combined to form a comb actuator 100. Finally, a conductive layer (not shown) is disposed on the substrate and operational elements of the actuator 100. Alternatively, the actuator may be fabricated by FLS and the linkage beam by 2PP, thereby effecting mechanical motion above the surface of the substrate instead of below it. More generally, any combination of actuator above and/or below the surface of the substrate 110 and mechanical linkage above and/or below the surface of the substrate is possible and within the scope of this disclosure.

The fabrication process for FLS and SMM is given in FIGS. 4A-4D. The first step is irradiation 112 of the substrate 110, as in the FLS+2PP process illustrated in FIG. 3A. The irradiated volume 112 forms a suspended or free-floating linkage beam 140 or other passive component to be moved by the actuator. Because the lithographic steps used in SMM must be done on a relatively planar surface, etching cannot be performed prior to SMM. Instead, in the second step, shown in FIG. 4A, a sacrificial oxide layer 50 is disposed on the substrate 110 and patterned with the required anchor points as vias 132. Alternatively, a sacrificial layer may be formed via irradiation of the substrate, and thereby obviate the need for the oxide 50. For example, in the case shown in FIG. 4A, a thin surface irradiation would be made everywhere except the anchor points 132. In the third step, given in FIG. 4B a doped polysilicon layer 60 is disposed on the patterned oxide 50. The polysilicon layer 60 forms a bond 62 with the glass substrate 110 and can be used to create anchor points 132 from which cantilevered or suspended elements can be formed. In the fourth step, exhibited in FIG. 4C, standard photolithography and selective etching are used to pattern the polysilicon layer 60 into the comb drive elements, with the etch slowing or stopping on the sacrificial oxide 50. In the final step of FIG. 4D, the irradiated features and sacrificial oxide 50 are preferentially etched away to form a slot 114 for the linkage beam 140 to occupy when actuated. Also, in this way suspended elements, such as a biasing element 130, may be formed. HF chemistry is used to etch both the sacrificial oxide 50 and the irradiated glass 112 preferentially over the polysilicon 60 and untreated substrate 110. In this process KOH chemistry may not be used because it readily attacks polysilicon. As previously mentioned, the doped polysilicon provides the conductivity necessary for actuator 100 operation. However, it is usually necessary to form metal contacts for practical electrical coupling to the outside world. For this purpose, a coarse shadow mask may be used. Alternatively, and with a sufficiently short HF etch time, a metal layer may be disposed and patterned on the substrate and then protected from the wet chemistry by suitable methods, such as thick photoresist. Alternatively, the actuator may be fabricated by FLS and the linkage beam by SMM, thereby effecting mechanical motion above the surface of the substrate instead of below it. Any combination of actuator disposed above and/or below the surface of the substrate and one or more mechanical linkage disposed above and/or below the surface of the substrate is possible and considered to be within the scope of this disclosure.

In the three fabrication methods disclosed herein, deposition of a conductive layer may be required to render insulating features conducting, strengthen mechanical features and/or form input/output electrical connections. Specifically, regarding the first requirement, it is necessary that the conductive layer be conformal to some degree to coat the sides of the tines of the comb actuator such that the electric field lines are substantially horizontal (parallel with the substrate), as illustrated in FIG. 1. Deposition of patterned conductive layers is often achieved with standard lithographic, deposition and etch methods. However, upon reviewing FIG. 2B, it is evident that the irradiated and etched substrate 110 now comprises the features of the actuator, such as trenches 114, undercuts or overhangs 116, and recesses with suspended elements 118 and is therefore no longer suitable for standard lithographic processing. Such processing involves the deposition of photoresist either as a spun-on viscous liquid or laminated film (dry resist). Either process is likely to fracture the delicate, flexible features of the actuator. Moreover, due to the fact that the actuator features may have high-aspect ratios, spun-on films such as photoresist are not likely to have the planarity required for a high-fidelity lithographic process. Finally, the development and cleaning processes, for example spin developing, immersion with sonication, and spin-rinse drying, usually include mechanical forces sufficient to compromise the integrity of the actuator. Therefore, only blanket conductive layer deposition, in which no mask is used, or a non-contact masking method, such as shadow masking, may be used. Shadow masking may be used for features with a minimum dimension on the order of 10 micrometers (microns) and therefore is a valuable method of fabrication for many MEM devices. Blanket deposition, especially conformal blanket deposition, typically produces a continuous metal layer and is therefore of little use in electrical devices. In this disclosure, however, several methods of segmenting such a layer are contemplated, allowing for maskless deposition, as discussed below. First, however, this discussion will benefit from an introduction to conformal coating deposition.

Two methods of conformal coating are contemplated herein; magnetron sputter deposition or evaporation with a suitable, planetary-type rotation of the substrate. Modified magnetron sputtering techniques have been developed to provide conformal coverage through a combination of coating re-sputtering and ionized physical vapor deposition (IPVD), the latter by use of a secondary plasma source or a pulsed high target power (HiPIMS). These and other plasma-based techniques are included by reference in the following description of sputtering.

Magnetron sputter deposition, commonly called sputtering, is a plasma-based coating method where positively charged energetic ions from a magnetically confined plasma collide with a negatively charged target material, ejecting (or "sputtering") atoms from the target that are then deposited onto a substrate. In the sputtering process, the sputtered atoms travel toward the substrate at a variety of angles. A low-power, high-pressure plasma results in a large angular distribution of the atomic flux centered around high oblique angles, whereas a high-power, low-pressure plasma results in a narrow angular distribution of the atomic flux centered around the vertical axis (i.e., the surface normal). Each distribution of angles produces a deposition layer that can conform to certain surface topographies of the substrate; these features may include vertical sidewalls, and/or even slightly re-entrant features. Continuous coating may be achieved for topographies with aspect ratios of up to 2:1 (height/width). However, under optimized conditions, contiguous conformal coating may be achieved for aspect ratios of up to 6:1 or more. As a rule of thumb, the conformal coatings are generally much thinner than the topography upon which they are deposited, as very thick deposition layers will themselves change the topography to the point where this rule no longer applies.

In an alternative deposition process, source material evaporation with planetary rotation of the substrate may be utilized. Here, planetary rotation means that the normal axis of the wafer is tilted with respect to the source, as the Earth's axis is tilted with respect to the sun. Then, as the wafer is made to rotate, the non-horizontal surfaces of a 3D feature will be exposed to the atomic flux from the source and coating of the exposed portions may therefore be achieved.

Figure 5:
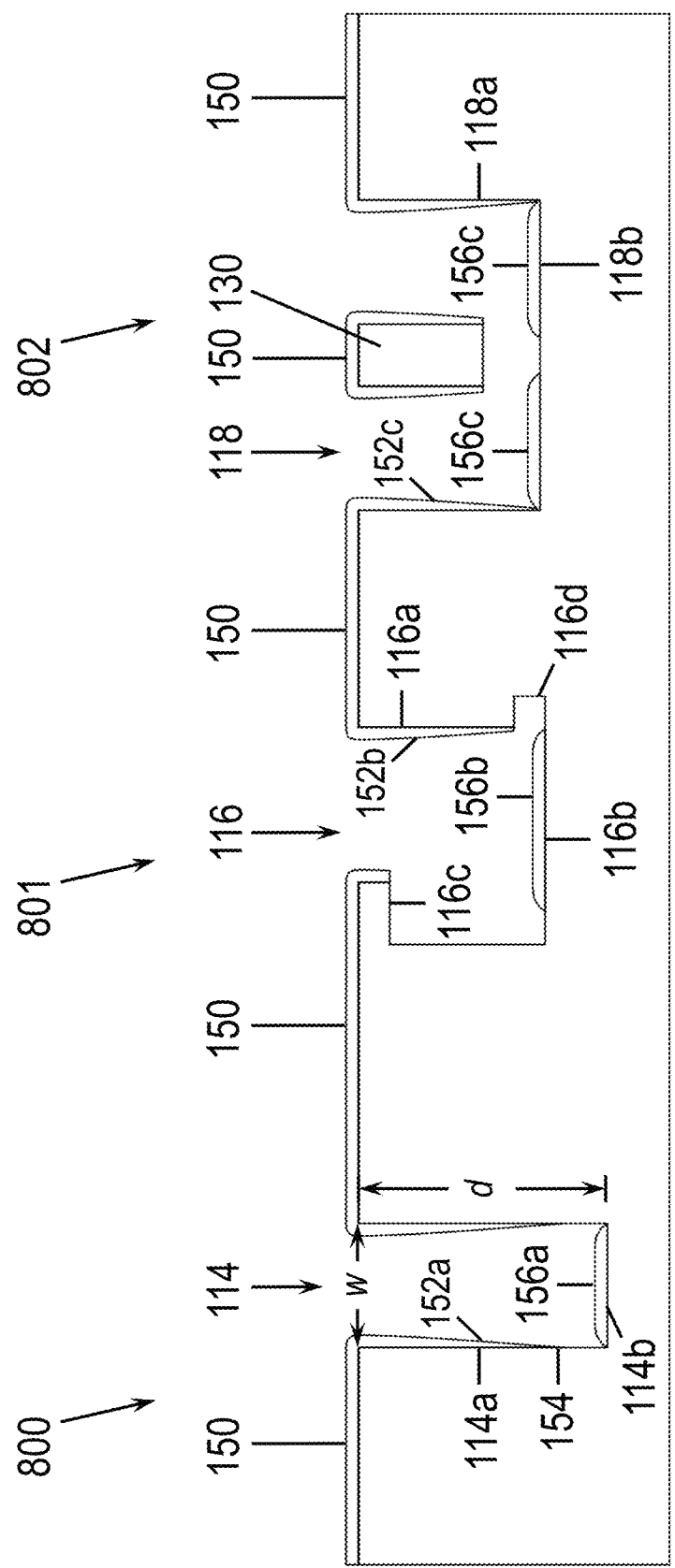
FIG. 5 illustrates a sectional view of a various structures etched into an insulating substrate for the purpose of segmenting a monolithically deposited conductive layer, including, from left to right, a simple trench, a trench having an overhang profile and/or an undercut profile, and a trench with a suspended element, according to an embodiment of the present invention.

The present invention provides for at least three structures for segmenting a single, monolithically deposited conductive layer without the need for liftoff or post-deposition etching. Conceptually, the conformal deposition can be thought of as having uniform thickness on every surface exposed to the deposition source, regardless of its angle with respect to the substrate surface, as represented in FIG. 2C. In practice, however, the layer thickness on a high angle surface, such as a vertical surface, tends to diminish with distance from the topmost horizontal surface. This may be a result of several factors: an atomic flux with a high angle of incidence, $\theta_{flux}$, shadowing effects, and atomic attraction forces. These phenomena cause the incident atoms to be preferentially deposited on the top corners of the trench and less preferentially down the sides of the trench. Therefore, a more accurate depiction of the conductive layer profile is illustrated in FIG. 5. The following description of segmentation structures assumes a stable process condition wherein the peak angle and distribution of the incident atomic flux is fixed.

In a first structure for effecting layer segmentation 800, shown on the left side of FIG. 5, a trench 114 is depicted wherein every surface is exposed to the incident and/or re-sputtered atomic flux. The trench may be of any shape that satisfies this condition, i.e., having no obscured surface(s). Nevertheless, the concepts and principles presented herein may be most easily understood for a trench with a rectangular profile having a vertical sidewall 114a of depth d and horizontal bottom 114b of width w. For non-rectangular profiles the width, w, is defined as the dimension of the trench opening (coincident with the substrate surface) while the depth, d, is defined as the vertical distance between the trench opening and its deepest point. With all surfaces exposed to the incident atomic flux, complete conformal coating may be expected. However, as previously described, atoms are deposited preferentially on the top corners of the trench while the conductive layer 150 deposited on the sidewall 114a exhibits a taper 152a. Therefore, a first structure for effecting layer segmentation 800 is a trench 114 of sufficiently high aspect ratio, d/w, such that the conductive layer terminates at a point 154 above the bottom of the trench 114b keeping the sidewall deposition layer 152a separated from the bottom surface 114b and/or deposition layer 156a.

In a second structure for effecting layer segmentation 801, depicted in the center of FIG. 5, a trench 116 comprising a sidewall 116a and bottom 116b further comprises an overhang 116c and undercut 116d. The terms "overhang" and "undercut" refer to the same feature, in that at least one portion of at least one surface that is obscured from the incident and/or re-sputtered atomic flux as, for example, a downward facing portion. Thus, the terms "overhang" and "undercut" may be used interchangeably. In the case of the present structure 801, the trench 116 may be of a sufficiently low aspect ratio such that, without the undercut 116d or overhang 116c, the sidewall 116a and bottom 116b surfaces may be coated contiguously, as, for example, layers 152b and 156b. Introducing an overhang or undercut feature results in a shadow zone where no deposition occurs. Thus, a second structure for effecting layer segmentation 801 is an undercut or overhang comprising at least one portion of at least one surface that is not exposed to the incident and/or re-sputtered atomic flux, thereby creating a deposition-free zone.

In a third structure for effecting layer segmentation 802, depicted on the right side of FIG. 5, a trench 114 is depicted wherein every surface is exposed to the incident and/or re-sputtered atomic flux. The trench may be of any shape that satisfies this condition, i.e., having no obscured surface(s). Nevertheless, the concepts and principles presented herein may be most easily understood for a trench with a rectangular profile having a vertical sidewall 118a and horizontal bottom 118b. The trench 118 further comprises a suspended element 130 separated from the surfaces of the trench 118 by a gap wherein the suspended element obscures at least one portion of at least one surface of the trench from the incident and/or re-sputtered atomic flux. The trench 118 may be of sufficiently low aspect ratio such that, without the suspended element, the sidewall 118a and bottom 118b surfaces may be coated contiguously, as exemplified by contiguous layers 152c and 156c. Introducing a suspended element 130 of the necessary geometry and position relative to the trench 118 results in a shadow zone where no deposition occurs, as appears between the two bottom deposition layers 156c. Hence, a third structure for effecting layer segmentation 802, is a suspended element of sufficient extent and proximity to the trench 118 to create a deposition-free zone.

Any combination of process condition (e.g., pressure, RF power, substrate bias, substrate angle, etc.) and feature profile (e.g., aspect ratio, sidewall shape, sidewall angle, suspended element, etc.) that gives rise to a deposition-free zone is suitable for segmenting a monolithically deposited conductive layer into separate electrodes/conductors and falls within the scope of this disclosure.

Figure 6A:
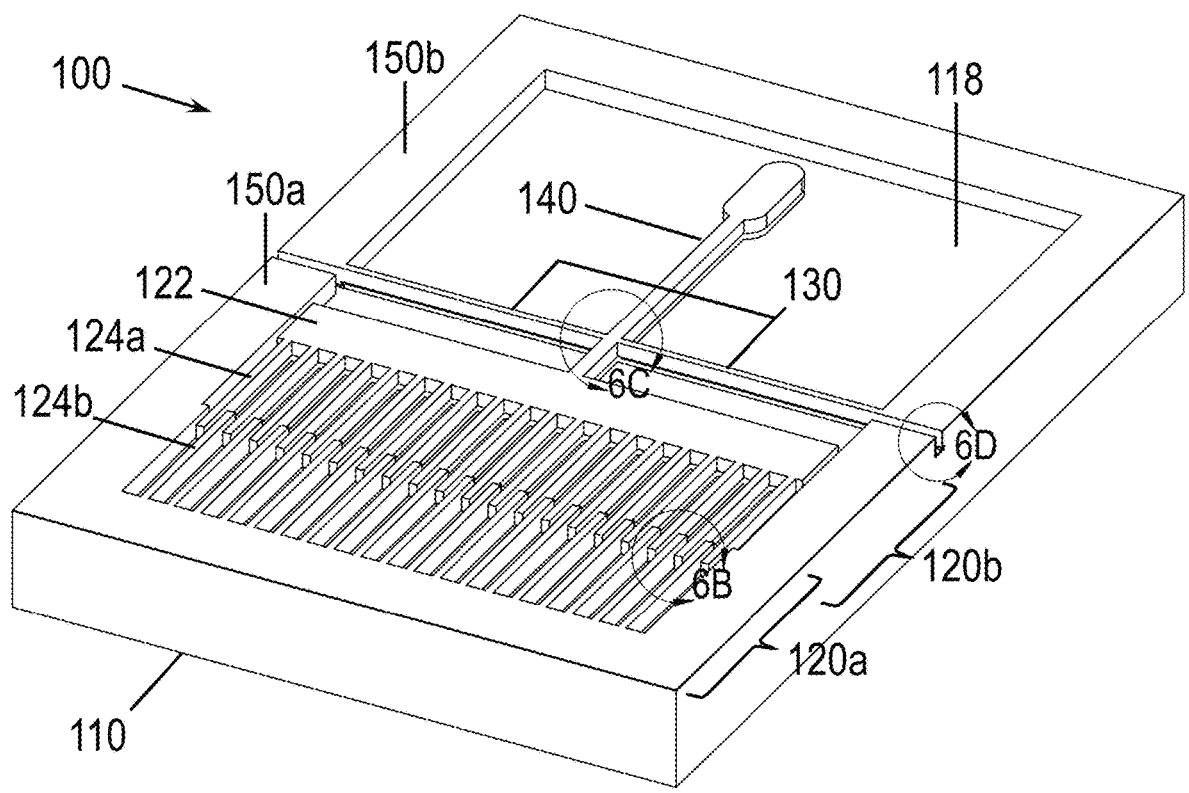
FIG. 6A illustrates a perspective view of a linear actuator, according to an embodiment of the present invention.
Figure 6B:
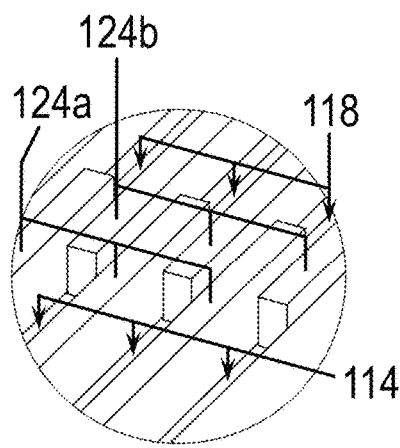
FIG. 6B illustrates an enlarged view taken from FIG. 6A, showing the interdigitated electrodes of a linear actuator with segmentation features, according to an embodiment of the present invention.
Figure 6C:
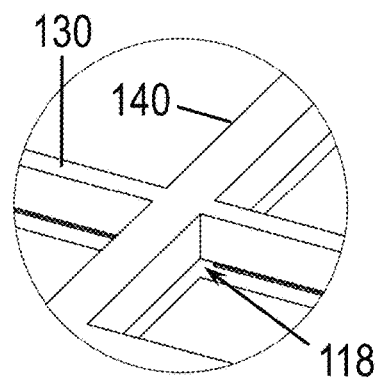
FIG. 6C illustrates an enlarged view taken from FIG. 6A, showing the biasing element and linkage beam intersection with suspended element segmented electrodes, according to an embodiment of the present invention.
Figure 6D:
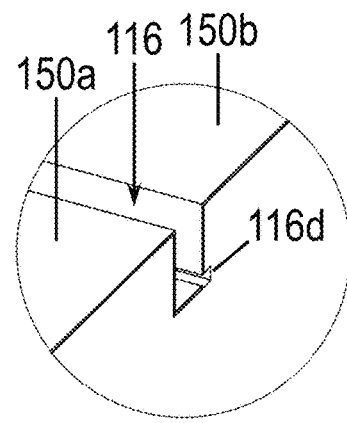
FIG. 6D illustrates an enlarged view taken from FIG. 6A, showing segmented electrodes via an undercut structure, according to an embodiment of the present invention.

FIGS. 6A-6D illustrate a first embodiment of the invention comprising an electrostatic comb actuator 100 fabricated on an insulating substrate 110. The insulating substrate 110 may be transparent to facilitate FLS as previously described, and may be made of glass or sapphire. Referring to FIG. 6A, the actuator 100 may comprise a pair of interdigitated combs, defined as fixed comb 120a and a moveable comb 120b. The fixed comb 120a may comprise one or more fixed tines 124a, which may form trench features 114, as previously described in relation to FIG. 5. The one or more fixed tines 124a may be electrically coupled at an end to a fixed electrode 150a. The moveable comb 120b may comprise a crossbeam 122 and one or more moveable tines 124b, which may form one or more suspended features 118, as previously described in relation to FIG. 5. The moveable comb 120b may be suspended by, or coupled to, one or more biasing elements 130, which may be complementary in nature, disposed above one or more recess features 118. The biasing elements 130 may be configured to provide an electrical connection to electrode 150b wherein the one or more biasing elements provide said connection at an end. On the other end of one or more biasing elements 130, a linkage beam 140 may be formed, for the purpose of imparting a drive force to a mechanical load. The biasing elements 130 act as compliant mechanisms and have appropriate physical properties to provide the capability of elastically deforming to effect linear motion of the actuator 100. A conductive layer may be disposed on the surface of the substrate 110, wherein the features defining the actuator 100 serve to segment the conductive layer into a fixed electrode 150a and a moveable electrode 150b. Referring to FIG. 6B, the overlapping portions of the respective ends of fixed tines 124a and moveable tines 124b are shown in greater detail. In operation, the overlapping portion of the tines 124a, 124b will vary according to the voltage applied across electrodes 150a, 150b, resulting in electrostatic attraction or repulsion of the combs 120a, 120b. Upon removal of the voltage, the moveable comb 120b returns to an initial rest position by action of the one or more restoring biasing elements 130. As may be observed, the actuator 100 may utilize each of the three methods of segmenting a monolithically deposited conductive layer, and without the need for liftoff or post-deposition etching, in order to form the electrodes. In FIG. 6B, trench features 114 are represented by the fixed tines 124a. Also, in FIG. 6B, suspended element features 118 are represented by the moveable tines 124b. In FIG. 6C, various features such as the biasing elements 130 and linkage beam 140 may similarly represent suspended element features. And in FIG. 6D, an undercut may be utilized, corresponding to the structures reflected in trench 116 as described in relation to FIG. 5. These segmentation techniques may be applied in any combination throughout any embodiment described herein.

Figure 7A:
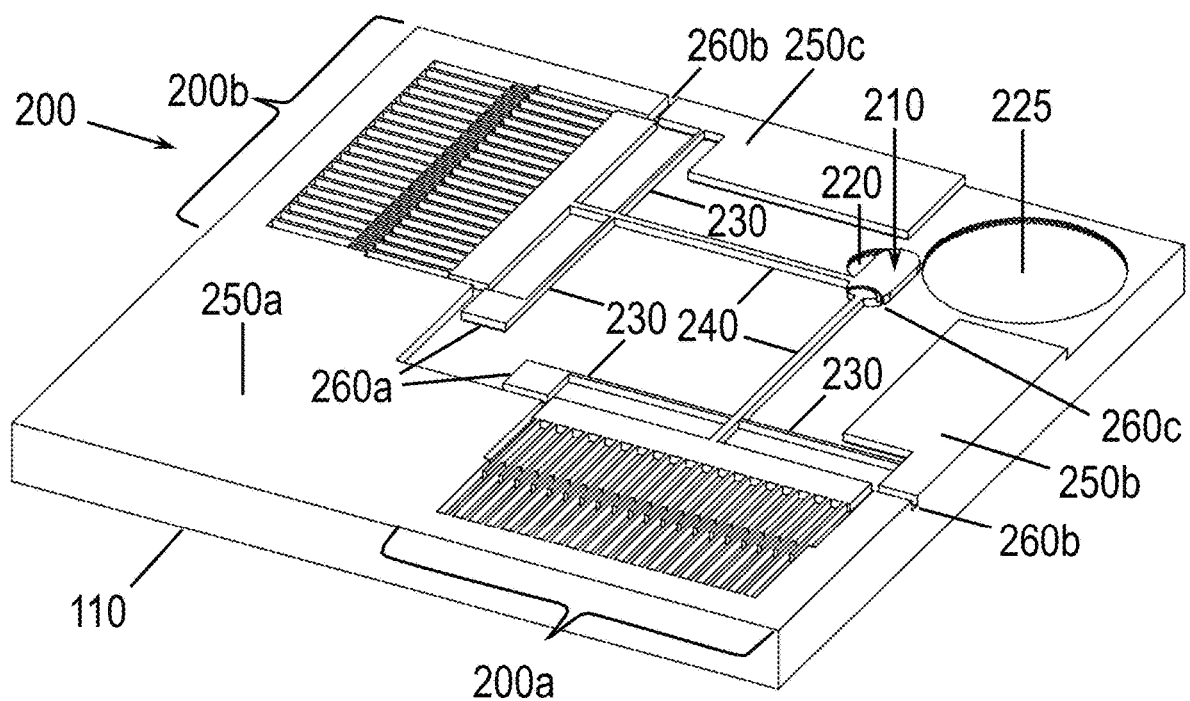
FIG. 7A illustrates a perspective view of a linear-rotational electrostatic comb actuator on an insulating substrate, according to an embodiment of the present invention.
Figure 7B:
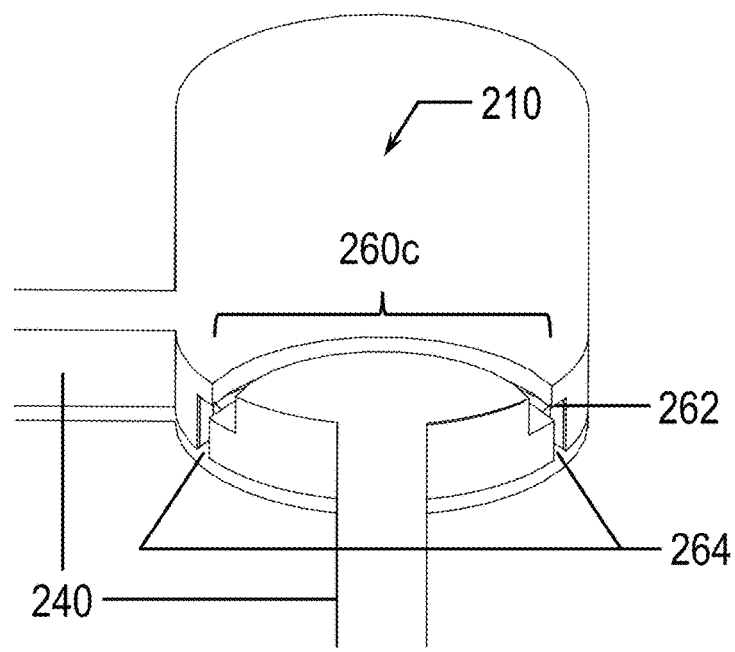
FIG. 7B illustrates an enlarged perspective view of electrode segmentation structures on a linkage beam of a linear-rotational electrostatic comb actuator on an insulating substrate, according to an embodiment of the present invention.

FIGS. 7A-7B illustrate a second embodiment of the invention comprising a linear-rotational actuator 200 fabricated on an insulating substrate 110. The insulating substrate 110 may be transparent to facilitate FLS as previously described, and may be made of glass or sapphire. Referring to FIG. 7A, linear-rotational actuator 200 may comprise first and second linear actuators, 200a and 200b, respectively. First and second linear actuators 200a and 200b may include analogous features, crossbars, tines etc., as previously described. Furthermore, linear actuators 200a, 200b may be positioned perpendicularly with respect to one another and may each be coupled to one or more biasing elements 230 and linkage beams 240. The linkage beams 240 may be connected to a rotating joint 210. With suitable input waveforms, first and second linear actuators 200a, 200b may be synchronized to induce a rotational motion in a wheel or cog, wherein the linkage beams 240 comprise lengths adequate to accommodate lateral bending imparted by operation of the actuator 200. The linkage beams 240 may rotate a drive cog 220, which, in turn, rotates a transmission cog 230. To effectuate locomotion, three electrodes may be utilized: a fixed comb electrode 250a, which may also act as an electrical ground; a first moveable comb electrode 250b corresponding to first linear actuator 200a; and a second moveable comb 250c corresponding to second linear actuator 200b. The electrodes 250a, 250b, and 250c may be segmented with respect to one another through the use of a combination of trench features, such as along fixed tine portions of the linear actuators 200a and 200b, suspended elements, such as along the portions of actuator 200 defining biasing elements 230 and linkage beams 240, and/or and undercut or overhang features defining structures 260a, 260b, and/or 260c. Importantly, the isolation of the first and second moveable comb electrodes 250b, 250c from each other may occur along the linkage beams 240, or at their intersection close to the rotational joint 210. Referring to the latter approach, FIG. 7B shows a double undercut structure 260c, which may be used to achieve separation. A first undercut in the shape of an arc 262 may be used to create a gap in the top surface metal, while one or more secondary undercuts 264 on either side of structure 260c may provide for separation of the sidewall conductive layer.

While the present embodiment as reflected in FIGS. 7A and 7B comprises two linear actuators, any number of linear actuators may be utilized, and fall within the scope of this disclosure. For example, actuator 200 may utilize three linear actuators, wherein the third actuator (not shown) may be disposed in a mirrored fashion, or otherwise arrayed around the rotational joint 210. Similarly, four or more linear actuators may be disposed in any manner appropriate to provide the requisite output force/torque. Additionally, each linear actuator may further comprise one or more pairs of tines configured for a specific application, such as to provide a specific amount of output force or torque. These principles, or alternatives, may similarly be applied to other embodiments disclosed herein.

Figure 8A:
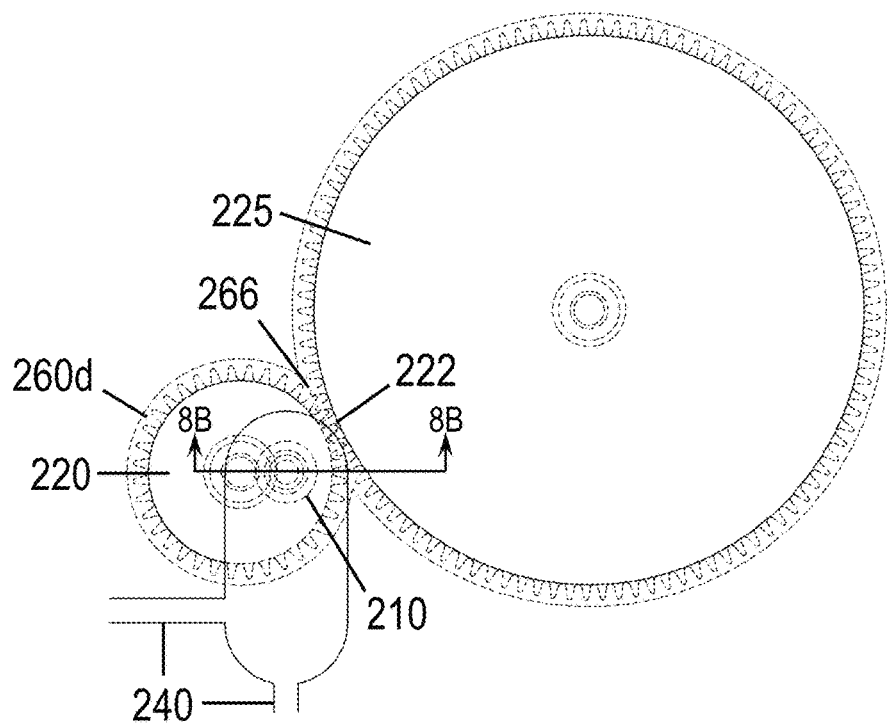
FIG. 8A illustrates a top view of a linkage beam, a rotating joint, and the cogs of a linear-rotational electrostatic comb actuator on an insulating substrate, according to an embodiment of the present invention.
Figure 8B:
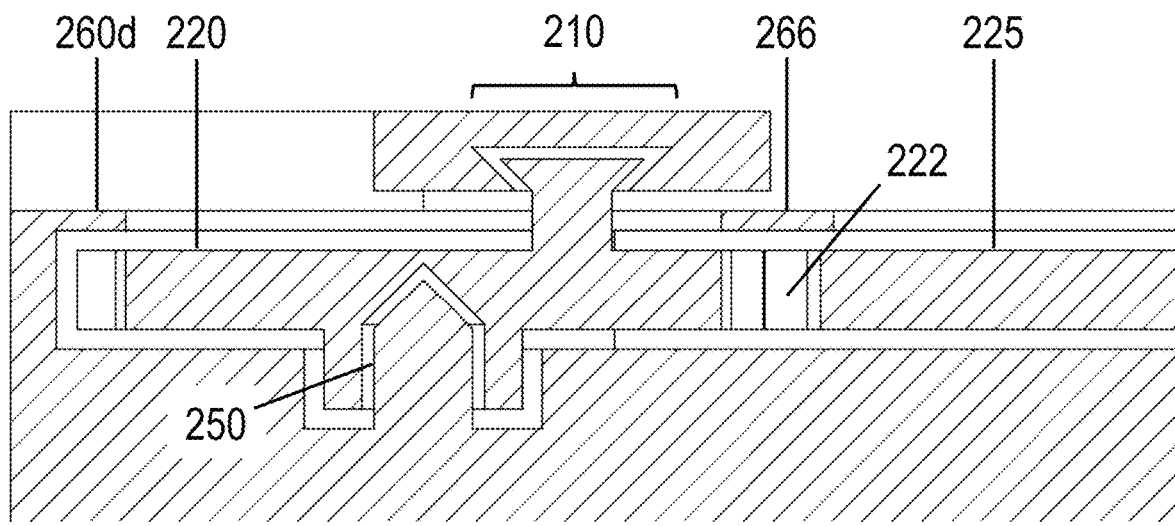
FIG. 8B illustrates a sectional view taken from FIG. 8A of a linkage beam, a rotating joint, and the cogs of a linear-rotational electrostatic comb actuator on an insulating substrate, according to an embodiment of the present invention.

In contrast to floating, flexible biasing elements 230 such as, for example, springs, both rotational joints and mechanically-contacting interfaces must be shielded from the conductive layer deposition process, or they may be locked in position by the deposited layer. According to the second embodiment and with reference to FIGS. 8A-8B, several examples of this concept may be observed. Referring now to FIG. 8A, one or more linkage beams 240 may be coupled to a rotational joint 210, which, in turn, may be coupled to a drive cog 220. Drive cog 220, then, may be coupled to a transmission cog 225. Additional cogs may be disposed above, below, or adjacent to the transmission cog 225 to further effect a desired gear ratio or mechanical torque. After fabrication via FLS, the teeth of the cogs 220, 225 may be either in contact with one another, or may be separated by a small gap. For this reason, the interference region 222 between cogs 220, 225, as depicted in FIG. 8B, must be shielded from the deposition process or they may be locked in position by the deposited layer. Shielding of the cog teeth may be achieved by an overhang 260d disposed on the circumference of the cogs. At the intersection 222 of the two cogs 220, 225, the overhang 260d may form a suspended bridge 266. Thus, the overhang 260d and suspended bridge 266 represent two ways in which localized layer deposition may be avoided, in a manner analogous to that described with reference to trenches 116 and 118 of FIG. 5.

Referring now to FIG. 8B, another manner of avoiding localized metal deposition may be seen. Here, a spindle 250 may be formed underneath the drive cog 220 such that it does not break the top surface of the cog 220. Similarly, the rotating joint 210 connecting the linkage beam 240 to the drive cog 220 is formed underneath, and within, the linkage beam assembly 240. In this way both the spindle 250 and the rotating joint 210 may be shielded from the incident flux. These concepts, design features, or alternatives, may similarly be applied to other embodiments disclosed herein.

Figure 9A:
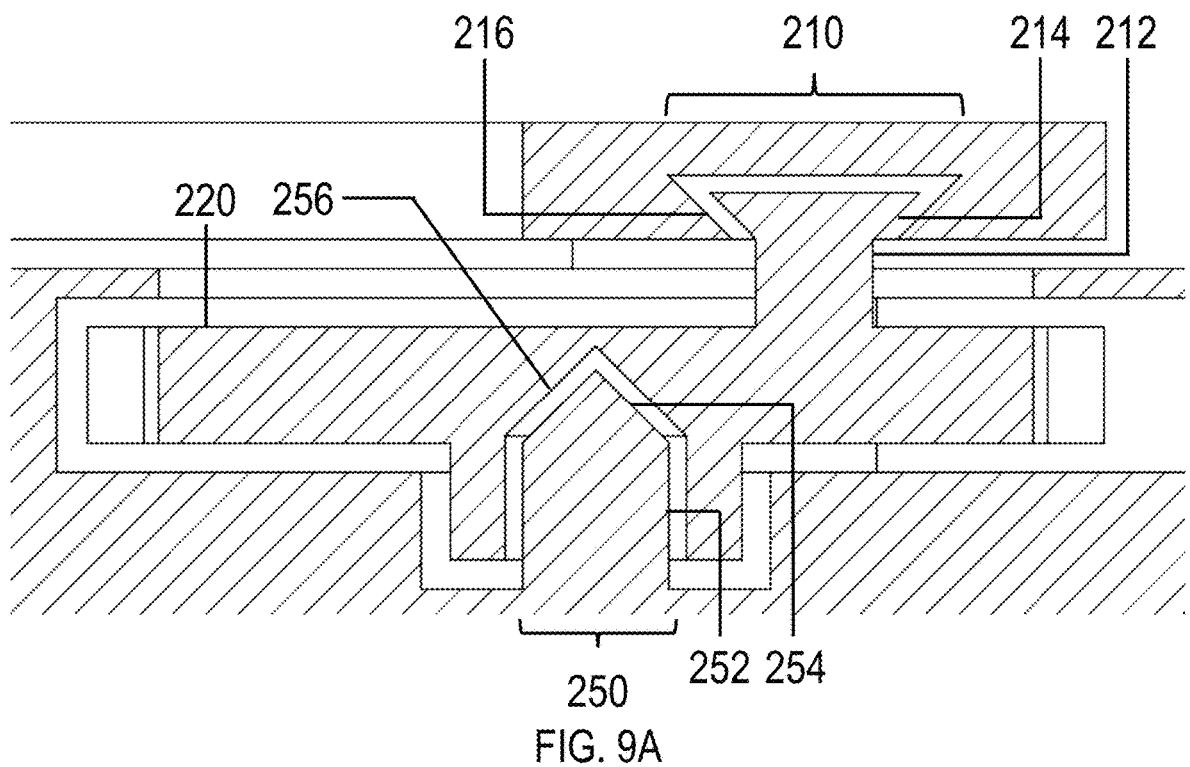
FIG. 9A illustrates a sectional view of an as-fabricated gap between a spindle and a cog and within a rotational joint of a linear-rotational electrostatic comb actuator on an insulating substrate, according to an embodiment of the present invention.
Figure 9B:
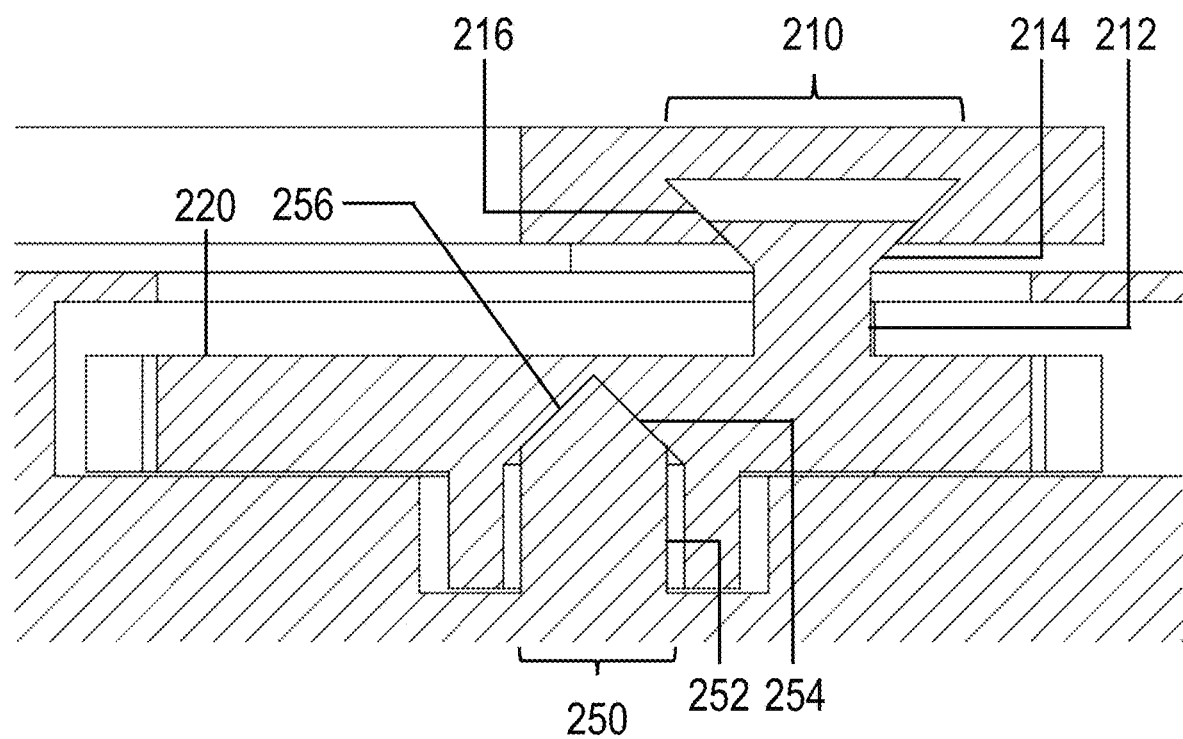
FIG. 9B illustrates a sectional view of post-fabrication gap removal by downward displacement due to gravity of a cog relative to a spindle and within a rotational joint in a linear-rotational electrostatic comb actuator on an insulating substrate, according to an embodiment of the present invention.

Referring to FIG. 9A, another aspect of the second embodiment is provided, which, as a primary objective, aims to obviate hysteresis from the system. FIG. 9A shows aspects of actuator 200, including drive cog 220, rotational joint 210, etc., in a post-fabricated condition wherein etching of the substrate has just been completed. As shown, the attendant gaps appear at, or along, all irradiated interfaces. These gaps, though small, may introduce some undesirable mechanical hysteresis in the motion of the actuator 200 and reduce the precision of its movement. In one aspect, and as provided in this exemplary embodiment, the present invention provides for reducing or eliminating one or more gaps by means of gravity and judicious choice of component geometry and configuration. Referring again to FIG. 9A, the spindle 250 may comprise a cylindrical shaft 252 with a cone-shaped tip 254. A spindle socket 256 having an offset shape from the spindle 250 may be formed in the underside of the drive cog 220. Referring to FIG. 9B the drive cog 220 may have dropped down under the influence of gravity and rest upon, or otherwise become coupled to, the spindle 250. The cone-shaped tip 254 may produce a centering force for the cog 220. In operation, as the cog 220 rotates, the spindle tip 254 and socket 256 surfaces are in constant contact, thereby eliminating any lateral movement that may be allowed or introduced to the system by the initial gap. These concepts, design features, or alternatives, may similarly be applied to other embodiments disclosed herein.

Referring again to FIG. 9A, the rotating joint 210 may comprise a cylindrical shaft 212 having a reverse cone-shaped flange 214 disposed thereon. The shaft socket 216, having an offset shape from the joint shaft 212 and flange 214, is formed in the underside of the linkage beam 140. As in the case of the cog spindle 250, the fabrication process produces a gap between components forming the rotating joint 210, namely between the flange 214, and socket 216. Referring to FIG. 9B, gravity has pulled the cog 220 onto the spindle 250, while the flange 214 now contacts, or is otherwise made to couple to, the linkage beam socket 216. As the cog 220 rotates, the flange 214 and socket 216 surfaces are in constant contact, eliminating any hysteresis due to the etch process-induced gap. Similarly, these concepts, design features, or alternatives, may similarly be applied to other embodiments disclosed herein.

Figure 10A:
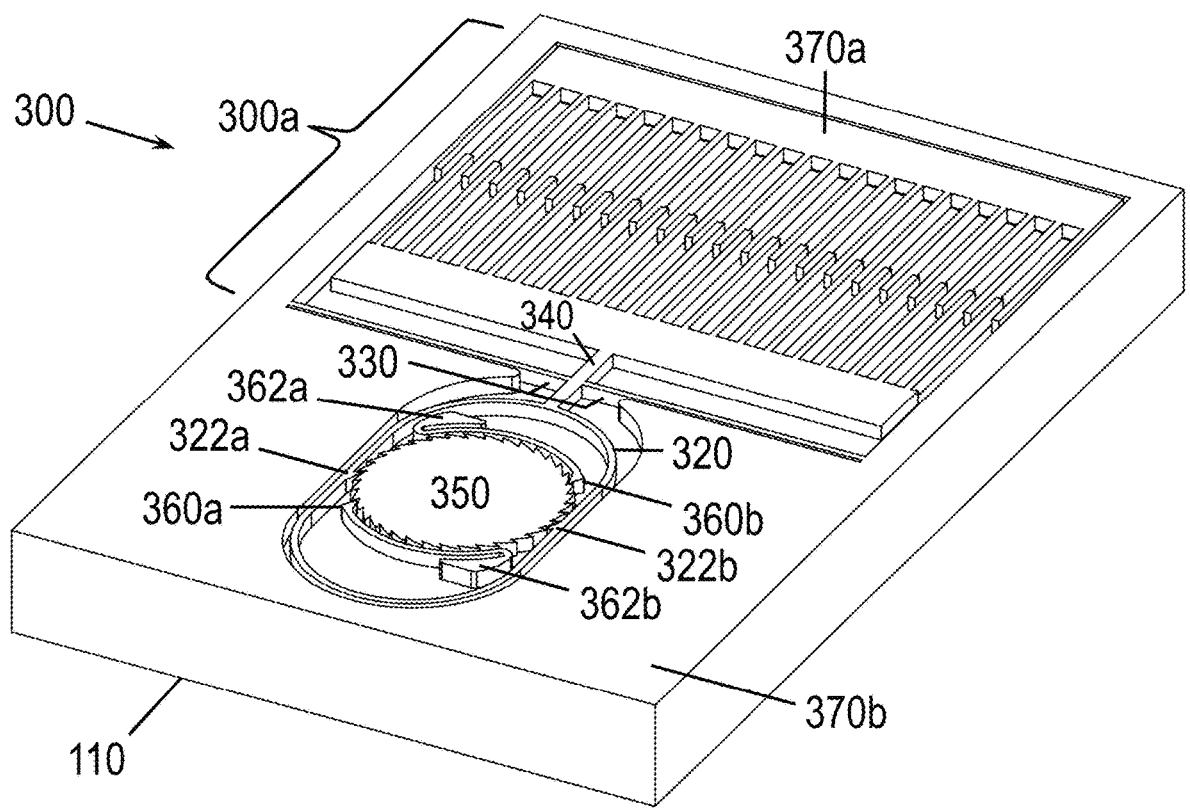
FIG. 10A illustrates a perspective view of a linear ratcheting actuator on an insulating substrate, according to an embodiment of the present invention.

FIG. 10A illustrates a third embodiment according to the present invention, comprising a linear ratcheting actuator (LRA) 300. The LRA 300 may comprise a linear actuator 300a coupled to a ratchet pawl 320 via one or more biasing elements 330 and linkage beam 340. The linear actuator 300a may thereby be configured to move the ratchet pawl 320, which engages a ratchet 350, causing it to rotate clockwise around a spindle (not shown), which may be disposed underneath. A pair of anti-reverse pawls 360a, 360b may also be configured to engage the ratchet 350 and, as each tooth passes by, pawls 360a, 360b may prevent the ratchet 350 from rotating counter-clockwise, as may otherwise be induced by the ratchet pawl 320 returning to an initial the rest position. At one end of each anti-reverse pawl 360a, 360b, defined as 362a and 362b, respectively, the ends may be affixed, or otherwise coupled to the substrate such that the pawls 360a, 360b may elastically deform during operation and return to their initial position. Thus, a small, reciprocating motion of the linear actuator 300a may be turned into complete rotational motion of the ratchet 350.

The LRA 300 may further comprise first and second electrodes, 370a, 370b, to apply a voltage thereto and effect actuation of LRA 300.

Figure 10B:
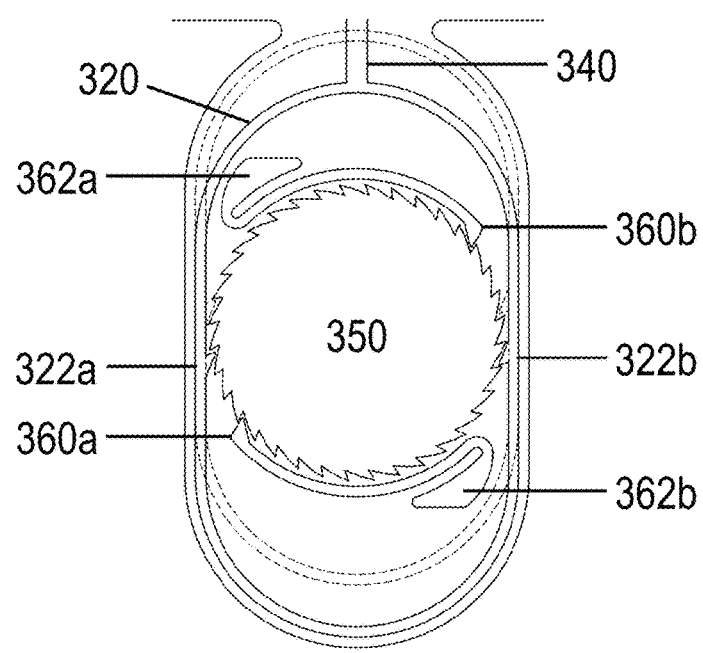
FIG. 10B illustrates an enlarged top view a ratchet wheel, forward driving pawls, and anti-reverse pawls of a linear ratcheting actuator on an insulating substrate, according to an embodiment of the present invention, where solid lines represent a rest position, and where dashed lines represent an actuated position.

In another aspect of the present invention the ratchet pawl 320 may comprise two branches 322a, 322b that flank the ratchet 350 on opposite sides. Each branch 322a, 322b may couple to the ratchet wheel 350, or otherwise engage the same, in unique and opposing directions, while providing for slippage in the other directions. The movement of actuator 300 may be characterized in terms of a two-stroke actuation. First, at the start of the actuator stroke, the linear actuator 300a and ratchet pawl 320 are disposed in a first, rest position, as illustrated by the solid-line portions shown in FIG. 10B, wherein left 322a and right branches 322b of the ratchet pawl 320 may be disposed to the lower side of the ratchet wheel 350. At the limit of the actuator stroke, in a second position represented by the dashed-line portions shown in FIG. 10B, the left branch 322a of the pawl 320 has engaged the ratchet 350 and rotated it by at least one tooth, while the right branch 322b of the pawl 320 has slipped past at least one tooth of the ratchet 350. Upon returning to the rest position, the right branch 322b of the pawl 320 engages the ratchet 350 and rotates it by at least one tooth, while the left branch 322a of the pawl 320 slips past at least one tooth of the ratchet 350. Thus, the ratchet wheel 350 may be made to rotate by the angular equivalent of at least two teeth per actuator cycle. Therefore, according to this configuration, the ratchet 350 turns at a rate that is at least twice as fast per drive cycle relative to a single pawl actuator. The present design, then, has advantages in both speed and efficiency.

Figure 11:
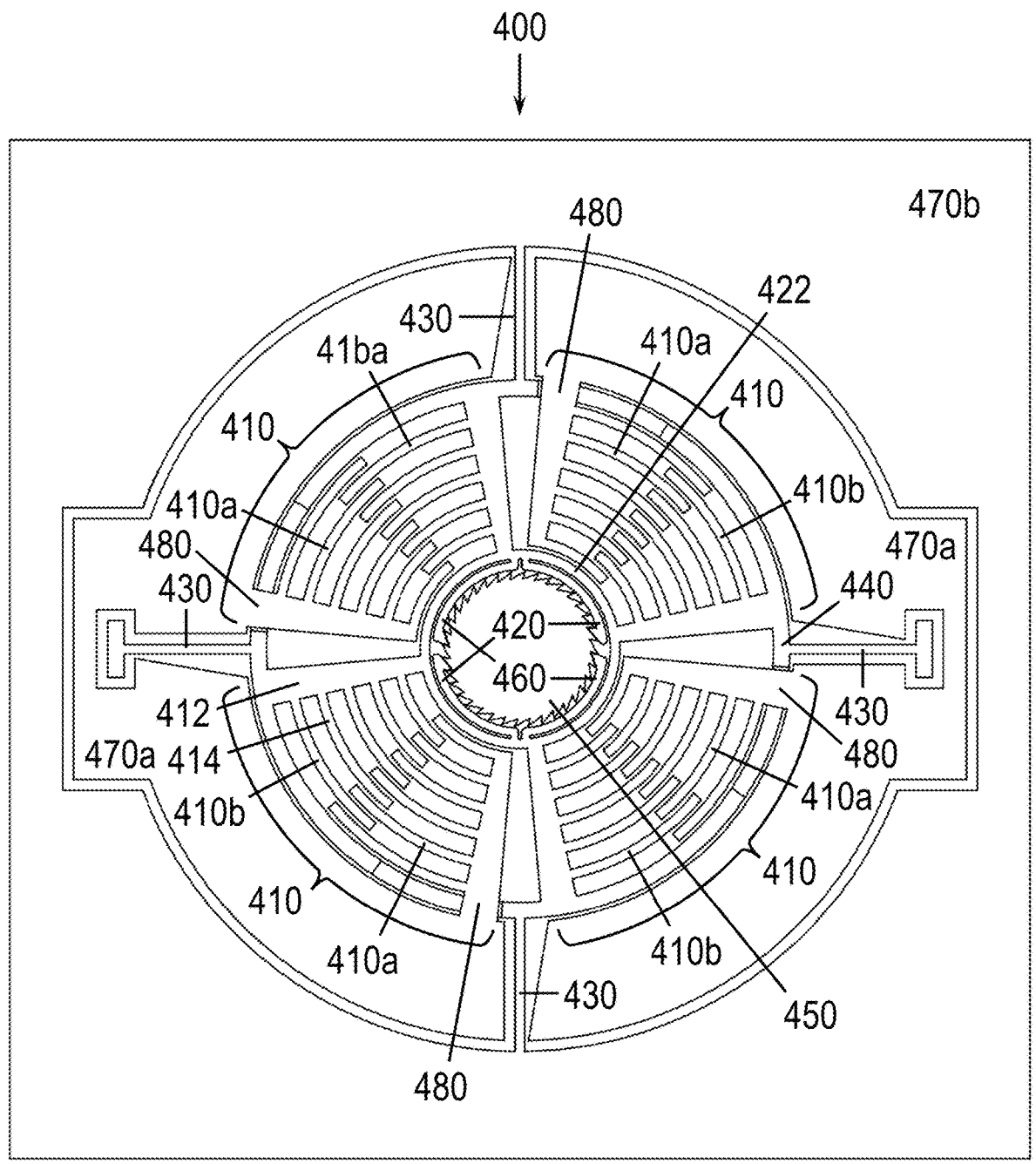
FIG. 11 illustrates a top view of a torsional ratcheting actuator on an insulating substrate, according to an embodiment of the present invention.

FIG. 11 illustrates a fourth embodiment of the present invention, comprising a torsional rotating actuator (TRA) 400. The TRA 400 may comprise one or more circularly-arrayed comb drives 410, which may each comprise a fixed comb 410a and a moveable comb 410b. Each comb 410a, 410b may comprise one or more curved tines 414, forming one or more pairs of tines. Each comb 410a, 410b may further comprise a crossbeam 412 disposed at an end of each set of one or more tines 414. The moveable combs 410b may be coupled to inner 422 and outer 440 rings. Flexible biasing elements 430 may be disposed around the circumference of the outer ring 440 and allow only rotational movement of the ring 440. The TRA 400 may further comprise one or more ratchet pawls 420 which couple to, or otherwise engage, a ratchet 450, causing counterclockwise rotation of the same around a spindle disposed underneath (not shown). One or more anti-reverse pawls 460 may also be configured to engage the ratchet 450 such that in operation, as each tooth passes by, they prevent the ratchet 450 from rotating clockwise with the ratchet pawls 420 during their biasing element-induced return to the initial rest position. In this way, a small, reciprocating, angular motion of the comb drives 410 may be turned into complete rotational motion of the ratchet 450. Three electrodes, two fixed 470a and one moveable 470b, may be used to apply a voltage to the combs 410. The fixed electrodes 470a may be coupled to the fixed combs 410a via bridges 480 that extend over, and are therefore decoupled from, the outer flexible ring 440. The moveable combs 410b may be tied together electrically by means of the inner ring 422. The inner ring 422 and moveable combs 410b may be coupled electrically to the outer ring 440, which, in turn, may be be coupled to a fixed bond pad 470b via one or more biasing elements 430. In this configuration of the TRA 400, the mechanical output is in the center, while the comb drives 410 are arranged concentrically around the mechanical output. Thus, a more compact design is achieved, and a benefit is obtained, as compared to other designs such as a tangent ratchet design, wherein a ratchet wheel rings the perimeter, thus requiring more surface area and complexity of parts.

The single-layer nature of the conductive layer deposition process described throughout this disclosure may, in general, present certain challenges for connecting electrodes in certain geometries. Electrodes must not only render the insulating material electrically conductive, but also provide for electrical connection to the outside world, such as when attempting to couple the electrode to a bond pad. The present disclosure enables the fabrication of electrically isolated traces that may connect separate electrodes where surface routing is possible. In contrast, any electrically active feature formed by a mechanically isolated island will be electrically, as well as mechanically, isolated. The present disclosure, therefore, provides at least two ways of bridging an electrical gap for such mechanically isolated features.

Figure 12A:
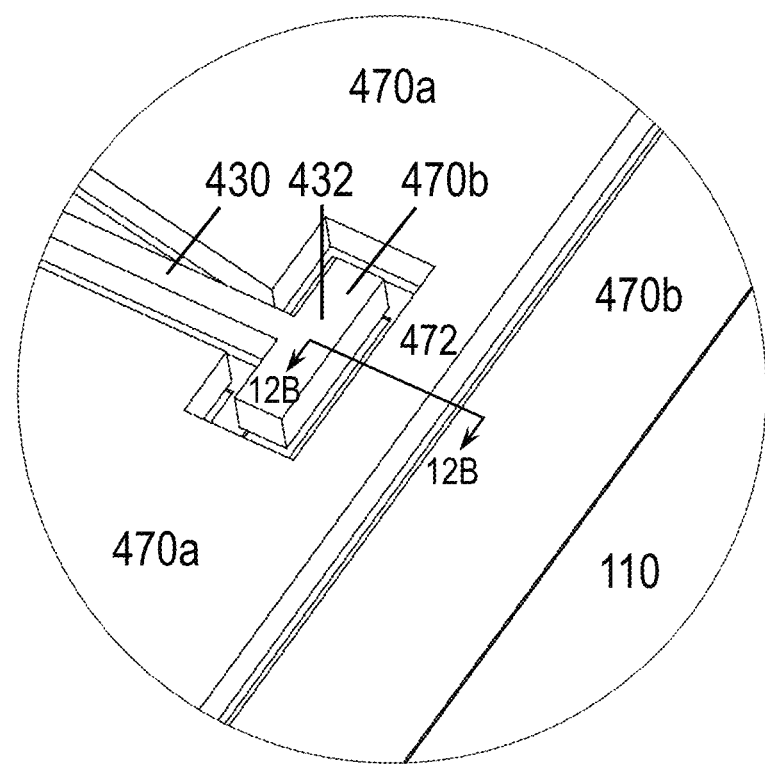
FIG. 12A illustrates an enlarged perspective view of an isolated trace structure connecting two electrodes of a torsional ratcheting actuator on an insulating substrate, according to an embodiment of the present invention.
Figure 12B:
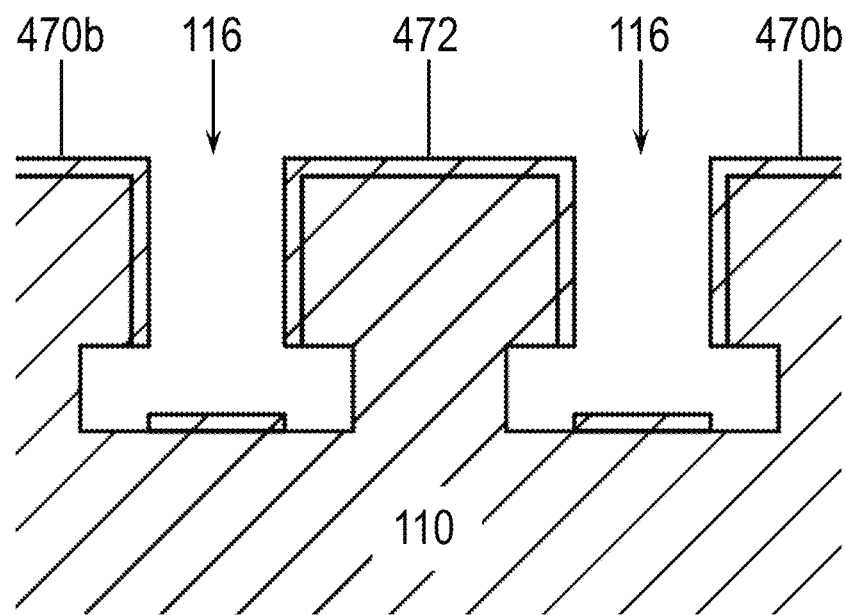
FIG. 12B illustrates a sectional view taken from FIG. 12A, showing the isolated trace of a torsional ratcheting actuator on an insulating substrate, according to an embodiment of the present invention.

In the surface routing method, illustrated in FIGS. 12A and 12B, an electrically isolated trace, or wire, can be generated by using a double-undercut profile. FIG. 12A shows a detailed view of a trace 472, which couples two or more fixed electrode bond pads 470a, according to the depiction provided in FIG. 11. The trace 472 may be routed around an anchor point 432, such as that of the biasing element 430, and bounded on the other side by the moveable electrode 470b disposed at an edge of the substrate 110. In this example, the biasing element 430 and anchor point 432 form part of the moveable electrode 470b. FIG. 12B shows a profile of the trace 472 according to the section taken in FIG. 12A. The trace 472 may be bounded on either side by an undercut trench 116. This ensures that the trace 472 is electrically isolated from the surrounding conductive layers 470b. Such traces may be routed wherever a continuous, horizontal surface connects two features that must share an electrical contact.

While surface routing of interconnects may be considered to be straightforward, and even preferred, connecting mechanically isolated elements is more challenging. For example, devices arranged in a concentric fashion include enclosed geometries that must be connected electrically, such as the features and methods disclosed in accordance with TRA 400. Referring to FIG. 11, the moveable electrodes 410b may be mechanically coupled by a pair of inner 422 and outer rings 440, with the comb crossbars 412 acting as spokes between them. Between the rings and spokes are, as shown, four fixed combs 410a that must receive the same electrical signal. In this embodiment/illustration, the mechanical isolation of the combs 410a results in electrical isolation as well.

Figure 13A:
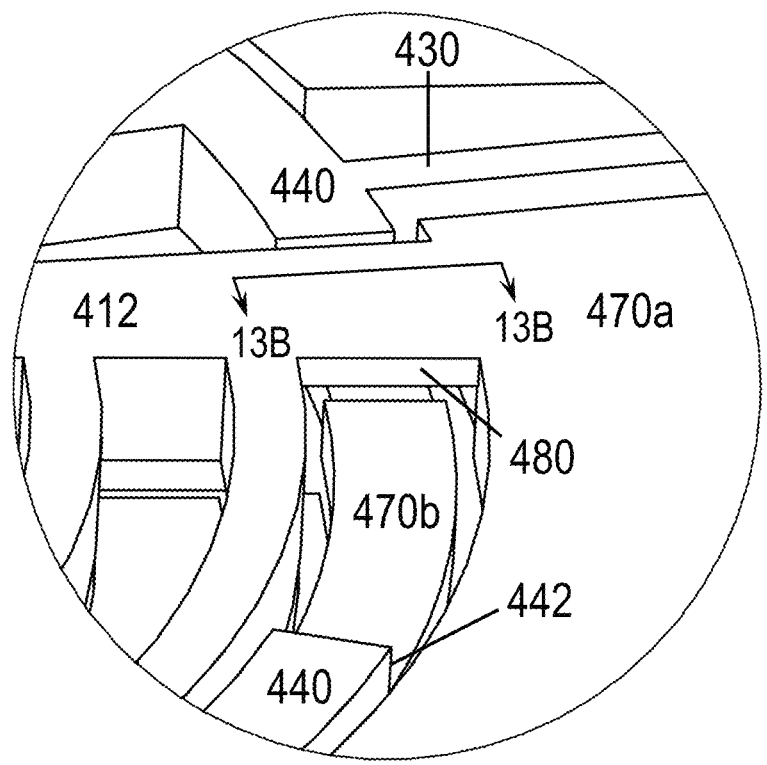
FIG. 13A illustrates an enlarged perspective view of a glass bridge connecting two electrodes over a moveable ring of a torsional ratcheting actuator on an insulating substrate, according to an embodiment of the present invention.
Figure 13B:
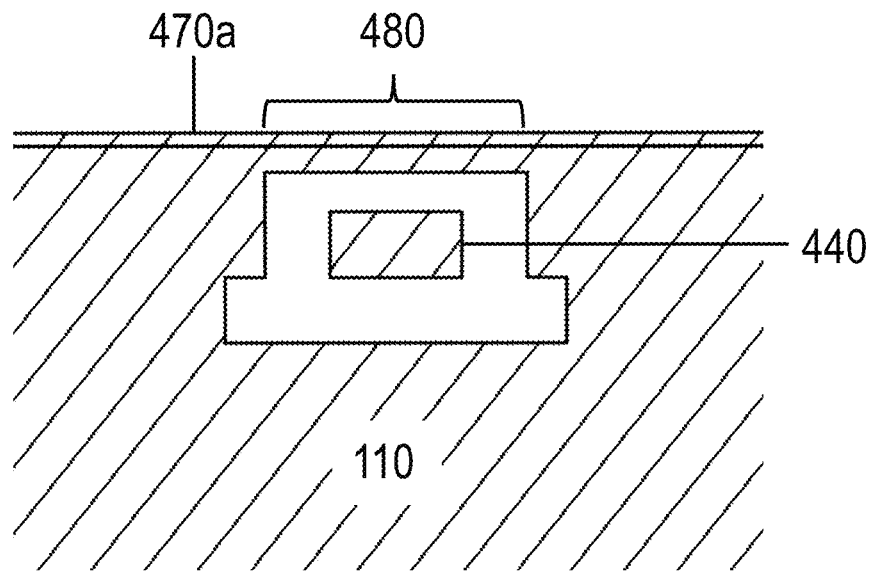
FIG. 13B illustrates a sectional view taken from FIG. 13A, showing the profile of the glass bridge and moveable ring of a torsional ratcheting actuator on an insulating substrate, according to an embodiment of the present invention.

In a first bridging method, wherein an island is connected to another element, shown in FIGS. 13A and 13B, a bridge 480 may be formed in the substrate 110 by means of FLS that allows the intervening element, herein depicted as the outer ring 440, to pass underneath, thereby maintaining mechanical and electrical decoupling with respect to the surrounding features. Referring to FIG. 13A, the fixed electrode bond pad 470a may be coupled to the fixed comb crossbar 412 via bridge 480, which may be processed glass, sapphire, or other FLS-processable material. Note that, in order for the ring 440 to pass under the bridge 480 without interference, a downward step 442 may be formed in the ring. In the sectional view provided by FIG. 13B, the outer ring 440 is seen to pass below the glass bridge 480. Alternatively, the entirety of the ring 440 may provide clearance for the bridge 480, thereby eliminating the downward step 442. Importantly, in this embodiment, the conductive layer is shadowed by the bridge 480 in the deposition process, resulting in moveable electrode 470b segmentation along the outer ring 440. However, since no shadowing occurs on the inner ring 422, the moveable combs 410b remain electrically contiguous.

Figure 14A:
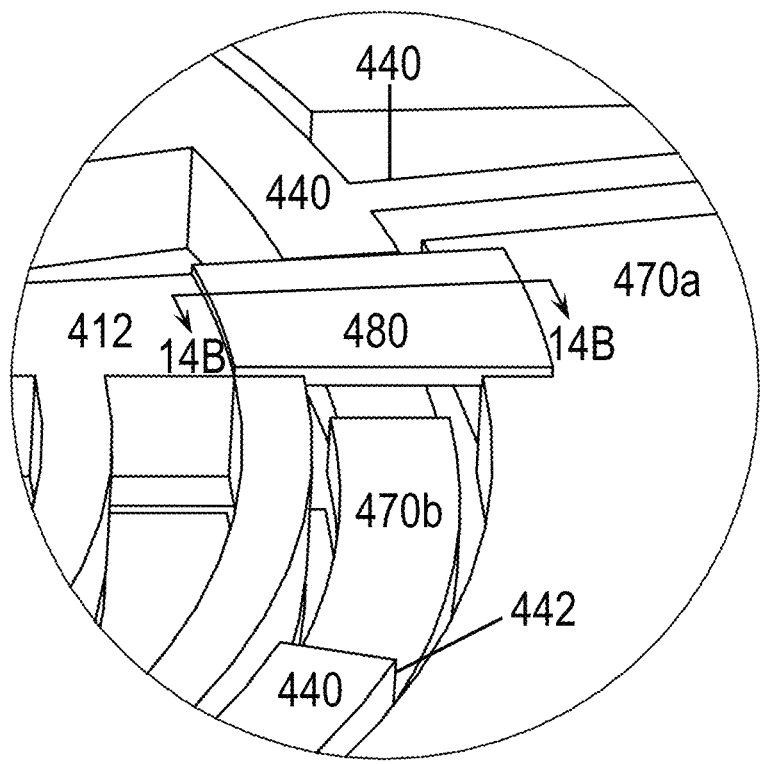
FIG. 14A illustrates an enlarged view of a thin film bridge connecting two electrodes over a moveable ring of a torsional ratcheting actuator on an insulating substrate, according to an embodiment of the present invention.
Figure 14B:
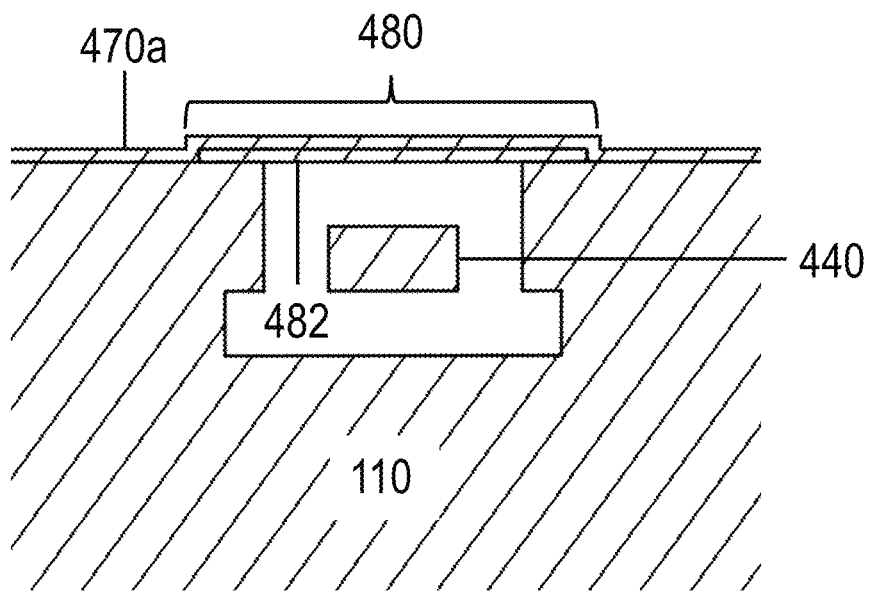
FIG. 14B illustrates a sectional view taken from FIG. 14A, showing the profile of the thin film bridge and moveable ring of a torsional ratcheting actuator on an insulating substrate, according to an embodiment of the present invention.

FIGS. 14A and 14B illustrate an alternate first method of bridging an island to another element. A thin layer of silicon nitride ($SiN_x$) 482 may be disposed on the irradiated wafer, prior to FLS processing of the substrate. The layer 482 may be deposited using low-pressure chemical vapor deposition (LPCVD), which may produce a very dense and pinhole-free film that is not attacked or delaminated by the wet chemical etches used for the irradiated glass. After deposition, the $SiN_x$ layer 482 may be patterned into the bridge structure 480 using standard lithography and dry etching, as shown in FIGS. 14A and 14B. A downward step 442 for mechanical clearance of the outer ring 440 with respect to the bridge 480 may still be required. However, the step 442 may be made shallower with respect to the previous embodiment, because the bottom of the bridge 480 sits at the original surface of the substrate 110, as illustrated in FIG. 14B. One skilled in the art may observe that other layers and process sequences may be used to raise the bridge above the original surface of the substrate 110, thereby avoiding the need for the step 442. The benefit of this alternative may, however, be weighed against the added complexity and cost for a given application.

Figure 15:
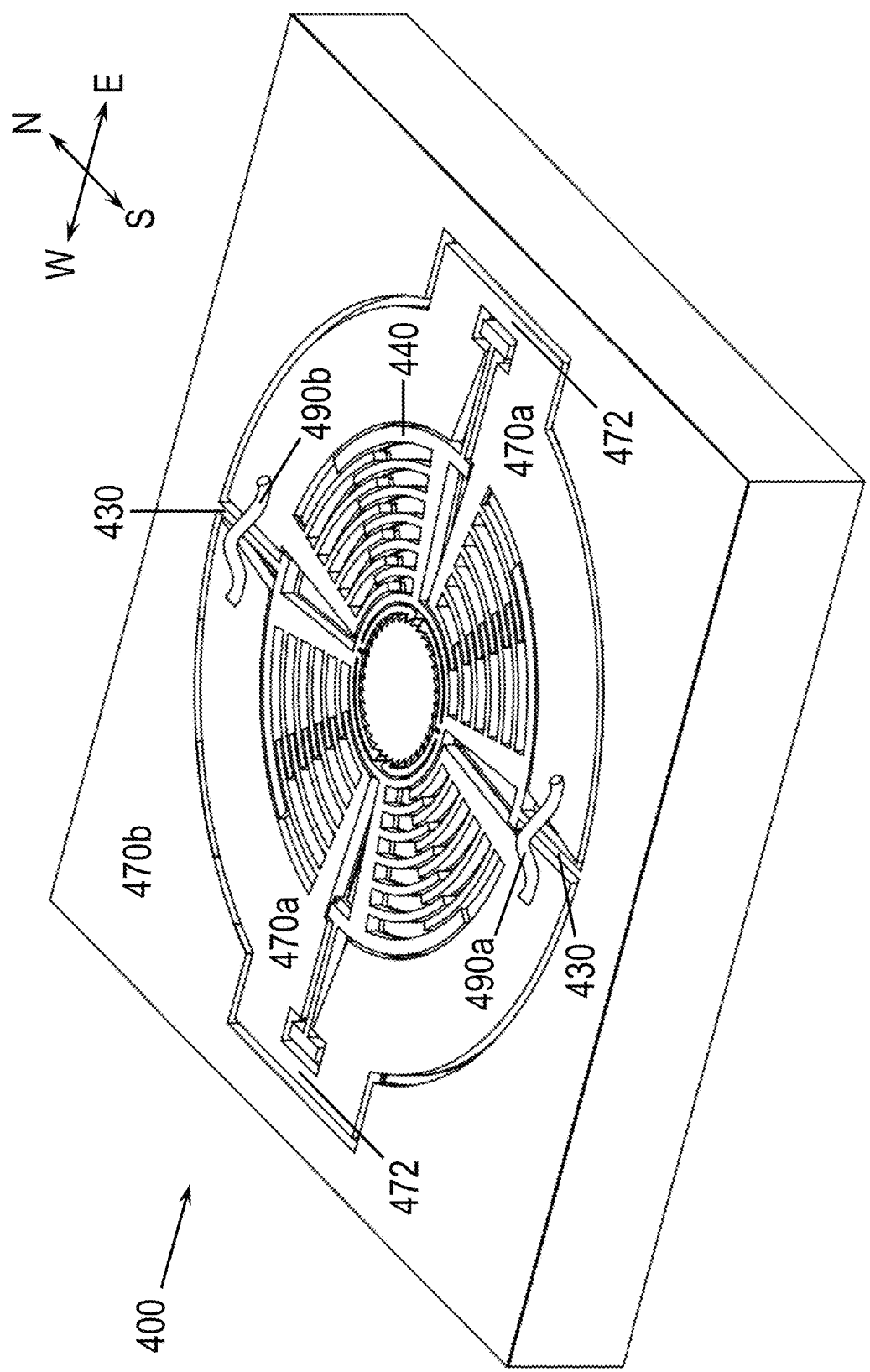
FIG. 15 illustrates a perspective view of a torsional ratcheting actuator on an insulating substrate having additional electrical connections made using wire bonds, according to an embodiment of the present invention.

A second method of bridging an island to another element is shown in FIG. 15. In a general TRA 400 the fixed electrode bond pads may be isolated from each other by the flexible electrode outer ring 440, biasing elements 430, and bond pad 470b. Using the isolated trace 472 method in accordance with that depicted in FIGS. 12A and 12B two pairs of the fixed electrode bond pads 470a may be connected in a north-south direction, leaving two bond pads 470a separated from each other in an east-west direction. Since the north and south biasing elements 430 are used to connect the flexible electrode outer ring 440 to the bond pad 470b, they must remain uncovered during the sputtering operation, removing the possibility of using a glass or $SiN_x$ bridge. Therefore, to connect the east-west halves of the fixed electrode, one or more bond wires 490a, 490b may be disposed between them, as illustrated in FIG. 15. Bond wires, 490a, 490b should be applied to fixed surfaces only, and may not be suitable for connecting flexible elements. In an alternative connection scheme contemplated within the scope of this disclosure, coupling the four fixed electrodes 470a may be achieved with three isolated traces 472 positioned, for example on the west, south, and east sides, while coupling the moveable electrode bond pad 470b to the outer ring 440 is accomplished via a single biasing element 430, as, for example, on the north side. Such interconnection schemes may be subject to cost/performance tradeoffs and/or the specific layout of the actuator.

The femtosecond laser structuring technique used to render the designs of the present invention have also been used to demonstrate various microfluidic channels and systems. Typically lacking from these designs are active components, such as pumps and valves, though they may be later added as discrete components. In one aspect of the present invention, electromotive power to active components, which may be integrated with passive microfluidic systems, is contemplated. The advantages of such a unified technology may include, inter alia, improved performance, such as valve switching speed, high pressure capability, and low power consumption, as well as size and cost benefits, which may include integration and miniaturization of complex systems.

The previous description of the disclosed embodiments is provided to enable any person skilled in the art to make or use the invention. Various modifications to these embodiments will be readily apparent to those skilled in the art, and the generic principles defined herein can be applied to other embodiments without departing from the spirit or scope of the invention. For example, a linear-ratcheting actuator may be configured with a vertically oriented ratchet instead of a horizontal one. It is therefore desired that the present embodiments be considered in all respects as illustrative and not restrictive, reference being made to the appended claims as well as the foregoing descriptions to indicate the scope of the invention.

What is claimed is:

1. A microelectromechanical device comprising:
    an insulating substrate characterized by an upper surface defining a plane including a first actuator formed therein, said first actuator comprising:
    a first electrode disposed on a stationary comb having a first plurality of spaced tines projecting from a first crossbeam; and
    a second electrode including:
        a moveable comb including a second plurality of spaced tines projecting from a second crossbeam in a direction, wherein said second plurality of spaced tines meshes with said first plurality of spaced tines in an interdigitated fashion; and
        at least one biasing element coupled to said moveable comb,
    wherein the stationary comb, the movable comb, and the at least one biasing element are formed below said plane,
    wherein said second electrode is electrically decoupled from said first electrode by at least one segmented feature selected from the group consisting of: a trench, an undercut, an overhang, and a suspended element,
    and wherein, in operation, a variable voltage is applied across said first electrode and said second electrode to induce displacement of said moveable comb parallel to said plane.

2. The microelectromechanical device according to claim 1 further comprising:
    a first linkage projecting outwardly from said second crossbeam at a first end of said first linkage,
    wherein said first actuator is a linear actuator,
    and wherein said output force is transmitted through to a second end of said first linkage.

3. The microelectromechanical device of claim 2 further comprising:
    a second linear actuator similarly formed within said insulating substrate and offset at an angle of about 90 degrees with respect to said first linear actuator, said second linear actuator further characterized by a second linkage configured to operate in conjunction with said first linkage of said first linear actuator, said second linkage being electrically decoupled from said first linear actuator, said second linkage being coupled to a second crossbeam of said moveable comb of said second linear actuator at a first end of said second linkage, wherein said output force of said second linear actuator is transmitted through to a second end of said second linkage,
    wherein, in operation, synchronized waveforms induce rotation of a cog assembly coupled to said first and second actuator portions.

4. The microelectromechanical device of claim 3, wherein said cog assembly further comprises a rotational joint coupling said second ends of said first and second linkages to a drive cog, said drive cog comprising a spindle disposed thereunder and to spin thereon, said drive cog being coupled to a transmission cog configured to effect a desired gear ratio or output a desired mechanical torque, wherein said rotational joint and said spindle are formed within said insulating substrate in a manner which does not inhibit movement of the same after completion of a conformal deposition process.

5. The microelectromechanical device of claim 1 further comprising:
    a first ratchet pawl coupled to said second end of said first linkage, wherein said first actuator is a linear actuator, said first ratchet pawl configured to engage a ratchet causing the same to rotate in a forward direction about a spindle disposed thereunder, thereby converting a linear motion to a rotational motion; and
    one or more anti-reverse pawls configured to engage said ratchet thereby preventing the same from rotating in a reverse direction,
    wherein the engagement of said first ratchet pawl with said ratchet occurs during a forward stroke of the linkage beam.

6. The microelectromechanical device of claim 5 further comprising:
    a second ratchet pawl disposed on an opposite side of said ratchet, said second ratchet pawl configured to engage said ratchet thereby causing the same to rotate in a forward direction about a spindle disposed thereunder,
    wherein the engagement of said second ratchet pawl with said ratchet occurs during a reverse stroke of the linkage.

7. The microelectromechanical device of claim 1 further comprising:
    a circularly disposed ratchet, wherein said first actuator comprises one or more rotational actuators radially arrayed adjacent to said circularly disposed ratchet, each of said moveable combs of said one or more rotational actuators including said one or more biasing elements being disposed radially at a first end of said moveable comb,
    one or more ratchet pawls disposed radially at a second end of said moveable comb of said one or more rotational actuators, said one or more ratchet pawls configured to engage said ratchet causing the same to rotate in a forward direction about a central axis, thereby converting a reciprocal rotational motion of said rotational actuators into a complete rotational motion of said circularly disposed ratchet.

8. The microelectromechanical device of claim 7 further comprising a linkage configured to couple said moveable comb of said one or more rotational actuators to said one or more ratchet pawls.

9. A silicon microelectromechanical device comprising:
    a first, stationary comb having a first plurality of spaced fingers extending from a first crossbeam;
    a second, moveable comb having a first plurality of spaced fingers extending from a second crossbeam toward the first crossbeam and meshing with the first plurality of fingers in an interdigitated fashion;
    at least one biasing element coupled to said second comb, said second comb configured to move in one dimension, said one dimension characterized by movement in a first direction in response to an applied voltage, and movement in a second direction upon removal of said applied voltage; and a ratchet pawl including first and second branches coupled to said second comb; and one or more anti-reverse pawls configured to engage said ratchet thereby preventing the same from rotating in an opposite rotational direction;

wherein said first branch, upon movement of said second comb in said first direction, is configured to engage a ratchet wheel to cause said ratchet wheel to rotate in a rotational direction;

and wherein said second branch, upon movement of said second comb in said second direction, is configured to engage said ratchet wheel to cause said ratchet wheel to rotate in said rotational direction.

\* \* \* \* \*